(12) United States Patent
Norell

(10) Patent No.: US 11,714,144 B2
(45) Date of Patent: Aug. 1, 2023

(54) CLOSURE AND SYSTEM FOR NMR SAMPLE CONTAINERS WITH A SECONDARY LOCKING SEAL

(71) Applicant: Norell, Inc., Morganton, NC (US)

(72) Inventor: Gregory B. Norell, Morganton, NC (US)

(73) Assignee: Norell, Inc.

( * ) Notice: Subject to any disclaimer, the term of this patent is extended or adjusted under 35 U.S.C. 154(b) by 113 days.

(21) Appl. No.: 17/136,294

(22) Filed: Dec. 29, 2020

(65) Prior Publication Data

US 2021/0149002 A1 May 20, 2021

Related U.S. Application Data

(63) Continuation of application No. 16/184,051, filed on Nov. 8, 2018, now Pat. No. 10,908,236, which is a continuation of application No. 14/739,753, filed on Jun. 15, 2015, now Pat. No. 10,126,380.

(51) Int. Cl.
*G01R 33/30* (2006.01)

(52) U.S. Cl.
CPC ........... *G01R 33/307* (2013.01); *G01R 33/30* (2013.01)

(58) Field of Classification Search
CPC ............................ G01R 33/465; G01R 33/307
See application file for complete search history.

(56) References Cited

U.S. PATENT DOCUMENTS

| | | | |
|---|---|---|---|
| 4,088,944 A | 5/1978 | Engler et al. | |
| 5,344,036 A | 9/1994 | Stanescu | |
| 5,397,989 A | 3/1995 | Spraul et al. | |
| 5,517,856 A | 5/1996 | Hoffman et al. | |
| 5,534,780 A | 7/1996 | Lilly | |
| 5,831,434 A | 11/1998 | Shigezane et al. | |
| 5,952,831 A | 9/1999 | Yamakoshi et al. | |
| 6,362,624 B1 | 3/2002 | Wand et al. | |
| 6,486,672 B1 | 11/2002 | Wand et al. | |
| 6,563,317 B2 | 5/2003 | Warden et al. | |
| 6,645,635 B2 | 11/2003 | Muraki | |

(Continued)

FOREIGN PATENT DOCUMENTS

| CN | 1378650 | 11/2002 |
|---|---|---|
| CN | 101499141 A | 8/2009 |

(Continued)

*Primary Examiner* — Dixomara Vargas

(74) *Attorney, Agent, or Firm* — The Belles Group, P.C.

(57) ABSTRACT

A selectively removable closure for closing the open end of an NMR sample tube having an open end and a closed end of the invention includes a cylindrical proximal first and a distal second portion, both portions substantially congruent to a central axis, the second portion has a hollow bore extending therethrough, the hollow bore has: a first and a second distal section, a central section and a proximal section. The first distal section has an inside diameter sized to accept the outside diameter of a preselected size NMR sample tube substantially without an interference, the second distal section has an interference that ends into the central section with a ramp with an angle to the central axis greater than 70 degrees, the central section corresponds in a locked position on the NMR sample tube with a locking ring at least partially surrounding the NMR locking tube to form a secondary locking seal.

20 Claims, 18 Drawing Sheets

(56) References Cited

U.S. PATENT DOCUMENTS

| | | | |
|---|---|---|---|
| 6,686,740 B2 | 2/2004 | Tschirky et al. | |
| 6,741,079 B2 | 5/2004 | Hofmann et al. | |
| 6,812,706 B2 | 11/2004 | Leung et al. | |
| 6,969,993 B2 | 11/2005 | Tschirky et al. | |
| 7,250,767 B2 | 7/2007 | Hofmann et al. | |
| 7,728,593 B2 | 6/2010 | Norell | |
| 8,054,080 B2 | 11/2011 | Norell | |
| 8,591,835 B2 | 11/2013 | Norell | |
| 10,126,380 B2* | 11/2018 | Norell | G01R 33/30 |
| 10,908,236 B2* | 2/2021 | Norell | G01R 33/30 |
| 2002/0196022 A1 | 12/2002 | Tschirky et al. | |
| 2008/0007262 A1 | 1/2008 | Yamauchi et al. | |
| 2009/0072829 A1 | 3/2009 | Norell | |
| 2009/0128151 A1* | 5/2009 | Norell | G01R 33/30 324/321 |
| 2011/0185826 A1* | 8/2011 | Norell | B01L 3/00 264/296 |
| 2012/0194194 A1* | 8/2012 | Norell | G01R 33/30 324/321 |
| 2012/0216633 A1* | 8/2012 | Norell | B01L 3/00 29/527.1 |
| 2016/0363639 A1* | 12/2016 | Norell | G01R 33/30 |
| 2019/0072622 A1* | 3/2019 | Norell | G01R 33/30 |

FOREIGN PATENT DOCUMENTS

| | | |
|---|---|---|
| CN | 102326077 A | 1/2012 |
| CN | 102955179 A | 3/2013 |
| CN | 103028452 A | 4/2013 |
| CN | 103240135 A | 8/2013 |
| CN | 104215675 A | 12/2014 |
| JP | H08184659 | 7/1996 |

\* cited by examiner

CAP FOR 5mm TUBE

CLOSURE AND SYSTEM FOR NMR SAMPLE CONTAINERS WITH A SECONDARY LOCKING SEAL

CROSS-REFERENCE TO RELATED APPLICATIONS

The present application is a continuation of U.S. patent application Ser. No. 16/184,051, filed Nov. 8, 2018, which is a continuation of U.S. patent application Ser. No. 14/739,753 filed Jun. 15, 2015, now U.S. Pat. No. 10,126,380, the entireties of which are incorporated herein by reference.

TECHNICAL FIELD

This application is generally related to sample containers for placing a sample for measurement of a property of the sample in an instrument, and more particularly, to closure devices and tubes for a Nuclear Magnetic Resonance (NMR) samples with a secondary locking seal.

BACKGROUND

Nuclear Magnetic Resonance spectrometry is widely used in chemical studies for structure determination as well as presence, absence or concentration of a particular component in a sample. An NMR spectrum of a sample is generally determined by placing the sample in an elongate sample tube, placing the tube containing the sample in the field of a powerful magnet and selectively irradiating the sample with preselected radiofrequency signals and recording the effects of these signals on the sample. The sample tubes are formed from glass and are supplied in several sizes ranging from diameters of 1 mm to about 10 mm with lengths of about four inches to about seven inches long. The resolution of the spectrometer may be adversely affected by asymmetries in the sample tube and its placement within the magnetic field and irradiation coils. Accordingly, users of NMR spectrometers seek sample tubes and holders that minimize asymmetry.

In an effort to "average-out" sample asymmetry, some spectrometers axially spin samples on which the spectrum is being determined. More recently, NMR spectrometers have the capability to average-out some sample asymmetry electronically without spinning, but sample placement and positioning in the sample chamber is still important to optimize the resolution of the spectrometer. These more recent NMR spectrometers also utilize the tube closure to suspend the sample axially in the sample chamber. Thus, tube closures or caps need to do more than just close the tube. When the samples are not spun, the coaxiality of the outer diameter, the closure and the inside diameter of the tube, if not consistent and precise, may adversely effect the quality of the spectrum obtained.

In many cases, the materials whose NMR spectrum is being determined are derived from expensive and difficult to repeat studies. Accordingly, if a sample is lost or degraded because of a malfunction of the sample closure or the tube, the user may experience a substantial and expensive delay in their study. Thus, although there are many types of NMR sample systems and tube closure devices available, there is still a need for an NMR sample system and closure which is reliable, simple to use and allows the user of an NMR spectrometer to fully utilize the resolution capability of the spectrometer. If such a device also was compatible with available automated sample handling equipment, a further benefit to the art of NMR spectrum determination would be realized. Such a system and closure is disclosed herein.

SUMMARY

A selectively removable closure for closing the open end of an NMR sample tube having an open end and a closed end includes a cylindrical proximal first and a distal second portion, both portions being substantially congruent to a central axis thereof. The second portion has a hollow bore extending therethrough. The hollow bore has three sections: a distal section; a central section; and a proximal section. The distal section has an inside diameter sized to accept the outside diameter of a preselected size NMR sample tube substantially without an interference. The central section is sized to provide a compliant interference fit with the outside diameter of the preselected size NMR sample tube. The proximal section is sized to accept the outside diameter of the preselected size NMR sample tube without interference, so that as the open end of the NMR sample tube is proximally axially inserted into the closure, the distal section guides the tube into the closure, the central section interference fit provides a user perceptible resilient resistance to the axial passage of the tube and the movement of the tube open end into the proximal section allows the user to perceive a lessened resistance of the movement of the tube followed by seating the tube open end substantially adjacent to the first portion of the closure.

A method for manufacturing a closure includes selecting a polymeric material in the form of an elongate cylinder; placing the elongate cylinder of the polymeric material in a lathe; shaping the elongate cylinder into a closure having a cylindrical proximal first and a distal second portion, both portions being substantially congruent to a central axis thereof, the second portion having a hollow bore extending therethrough, the hollow bore having a distal section, a central section and a proximal section, the distal section having an inside diameter sized to accept the outside diameter of a preselected size NMR sample tube substantially without an interference, the central section sized to provide a compliant interference fit with the outside diameter of the preselected size NMR sample tube, and the proximal section sized to accept the outside diameter of the preselected size NMR sample tube without interference; and removing the finished closure from the lathe.

A method for determining the NMR spectrum of a material includes placing an aliquot of a suitable solvent containing a sufficient amount of a material of which an NMR spectrum is to be determined in a preselected size NMR sample tube having an open end and a closed end defining a cavity for receiving the aliquot; applying a closure to the open end of the NMR tube, the closure having a cylindrical proximal first and a distal second portion, both portions being substantially congruent to a central axis thereof, the second portion having a hollow bore extending therethrough, the hollow bore having a distal section, a central section and a proximal section, the distal section having an inside diameter sized to accept the outside diameter of the preselected size NMR sample tube substantially without an interference, the central section sized to provide a compliant interference fit with the outside diameter of the preselected size NMR sample tube, and the proximal section sized to accept the outside diameter of the preselected size NMR sample tube without interference so that the open end of tube is disposed adjacent to the first portion of the closure; grasping the closure picking up the sample tube having the material therein; placing the closed sample tube into a sample cavity of an NMR spectrometer; and operating the NMR spectrometer to determine the spectrum of the material.

The closure and sample tube system of the invention provides users of NMR spectrometers with a selectively removable closure for NMR sample tubes which is easily and securely placed on the tube. The closure of the invention maintains a seal, even if the open end of the tube is chipped or not square, because it does not depend on the extreme top of the tube for the retention and seal of the tube. In some embodiments, the system of the invention incorporates the closure of the invention cooperatively sealingly engaging an area of reduced outside diameter of the tube. In substantially all of the embodiments, the closure of the invention enables the user to grasp the cap for picking up and placing the tube without worrying that the cap may separate from the tube and cause the sample to be lost. Additionally, some embodiments of the closure and sample tube system of the invention may be utilized with various available auto sampling systems.

One or more embodiments of the present invention provide a removable closure for closing an open end of an NMR sample tube. The NMR sample tube having an open end, a closed end, and an outside diameter. The closure may comprise a cylindrical proximal first portion and a distal second portion, both portions being substantially congruent to a central axis thereof. The first portion may have a closed end and the second portion defining a hollow bore extending therethrough. The hollow bore may have a first distal section, a second distal section, a central section and a proximal section, the first distal section having a further distance to the proximal section than the second distal section. The first distal section may have an open end with an inside diameter sized to accept the NMR sample tube. The first distal section may have an inside diameter decreasing towards the second distal section and forming an increasing interference with the NMR sample tube. The first distal section may end with an increase in the inside diameter of the removable closure of at least 0.003 inch to transit into a beginning of the second distal section, the inside diameter of the second distal section increasing toward the closed end with an angle that is greater than 70 degrees relative to the central axis. The second distal section may have an open end with an inside diameter sized to accept the NMR sample tube substantially without interference, the central section being tapered and sized to provide a compliant interference fit with the outside diameter of the NMR sample tube, and the proximal section being near the proximal first portion, being tapered and being sized to accept the outside diameter of the NMR sample tube without interference.

Other embodiments of the present invention may provide a NMR sample tube having a locking ring at least partially surrounding the outside diameter of the NMR sample tube. The locking ring may be at a position that coincides with a position of the second distal section of the removable closure closing the NMR sample tube in a closed position. Embodiments of the invention may comprise a locking ring of material deposited on the outside of the NMR sample tube. That material may comprise ink.

In one or more embodiments of the present invention, the material that is deposited on the outside of the NMR tube is deposited by a screen printing process.

In various embodiments, the NMR sample tube has a marking region containing a mark with an edge that determined the position of the locking ring.

The material deposited on the NMR tube, such as the material of the locking ring, may have a thickness after being cured in the range of 0.0002 inches to 0.0003 inches. Various embodiments of the invention may have a locking ring width of 0.028 inches centered at a distance of 0.144 inches from the open end of the NMR tube. In other embodiments, the NMR tube does not comprise a locking ring.

In one or more embodiments, the removable closure may be made of low density polyethylene (LDPE).

One or more embodiments of the present invention provide a spectroscopy apparatus comprising a Nuclear Magnetic Resonance spectroscopy (NMR) sample tube with a material deposited on the outside surface of the NMR sample tube as one or more bands spanning more than ¼ of the circumference of the NMR sample tube. In one or more embodiments, the NMR sample tube has a length of approximately 7 inches and at least part of the one or more bands is located at one or more of the following positions on the NMR sample tube: 2.7755 inches above the closed end of the sample tube; 4.5465 inches above the closed end of the sample tube; 5.750 inches above the closed end of the sample tube; 6.25 inches above the closed end of the sample tube.

In one or more embodiments, the material deposited on the outside of the NMR sample tube has a friction coefficient of greater than 0.15. Further embodiments of the present inventions may comprise one or more band that are continuous or discontinuous. The one or more bands of deposited material may be approximately 0.669 inches wide relative to the length of the sample tube, and may be deposited with a thickness of approximately 0.00025 inches.

Alternative embodiments of the present invention provide a material that is deposited on the outside of an NMR tube, wherein the material comprises an epoxy based screen printing ink, from 70 to 97% w/w; a catalyst, from 3 to 10% w/w; and a silica filler, from 0 to 20% w/w. In yet other embodiments, the epoxy based screen printing ink comprises about 93.8% w/w; the catalyst comprises about 3.6% w/w; and the silica filler comprises about 2.6% w/w.

Various embodiments of the present invention provide curing the material that is deposited on the outside of the NMR tube without discoloration of the ink. One embodiment provides the deposited material cures without any discoloration of the ink perceivable to the human eye after being heated to about 250 degrees F. for about 3 minutes. In other embodiments, the epoxy based screen printing ink is white with no yellowing perceivable to the human eye after being heated to about 250 degrees F. for about 3 minutes.

One or more embodiments of the present invention provide a spectroscopy system comprising a Nuclear Magnetic Resonance spectroscopy (NMR) sample tube having an open end and a closed end and a turbine having a proximal end and a distal end, the turbine defining a hollow bore from the proximal end to the distal end of the turbine, the NMR sample tube seated inside the hollow bore with closed and open ends positioned outside the hollow bore, the turbine having a first contact position in the proximal half of the turbine and a second contact position in the distal half of the turbine, the first and second contact position being located approximately 1.771 inches apart. The NMR sample tube may have a material deposited on the outside surface as two bands spanning more than ¼ of the circumference of the NMR sample tube, wherein the first contact point touches at least part of one of the two bands while, simultaneously, the second contact point touches at least part of the other of the two bands.

In various embodiments, one or more edges of the two bands line up with the proximal or distal end of the turbine and/or line up with the first or second contact position of the turbine.

In other embodiments, a removable closure, as described above, may further comprise an NMR sample tube with the closure seated on the open end of the NMR sample tube. The internal diameter of the closure may be increased relative to a starting diameter by exposure to a solvent vapor for 1.5 hours, wherein the closure maintains seating on the open end of the NMR sample tube while the closure and sample tube are lifted vertically by only the closure, with the closure and NMR sample tube aligned vertically.

In yet other embodiments, the removable closure as described above, may be seated on the open end of the NMR sample tube, wherein the internal diameter of the closure is increased relative to a starting diameter by exposure to a solvent vapor for more than 1.5 hours and the closure maintains seating on the open end of the NMR sample tube while the closure and sample tube are lifted vertically by only the closure, with the closure and NMR sample tube aligned vertically.

In yet other embodiments, the removable closure described above further comprises an NMR sample tube, the closure seated on the open end of the NMR sample tube, wherein the internal diameter of the closure is increased 0.16% relative to a starting diameter by exposure to a solvent vapor, with the closure maintaining seating on the open end of the NMR sample tube while the closure and sample tube are lifted vertically by only the closure, with the closure and NMR sample tube aligned vertically.

In yet other embodiments, the removable closure described above may be seated on the open end of the NMR sample tube, wherein the internal diameter of the closure is increased greater than or equal to 0.16% relative to a starting diameter by exposure to a solvent vapor, and the closure maintains seating on the open end of the NMR sample tube while the closure and sample tube are lifted vertically by only the closure, with the closure and NMR sample tube aligned vertically.

Before describing several exemplary embodiments of the invention, it is to be understood that the invention is not limited to the details of construction or process steps set forth in the following description. The invention is capable of other embodiments and of being practiced or being carried out in various ways.

DETAILED DESCRIPTION

Reference throughout this specification to "one embodiment," "certain embodiments," "one or more embodiments" or "an embodiment", means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment", in various places throughout this specification are not necessarily referring to the same embodiment of the invention. Furthermore, the particular features, structures, materials, or characteristics may be combined in any suitable manner in one or more embodiments. In this description, the term "proximal" refers to the direction away from the closed end of the sample tube and the term "distal" refers to the direction toward the closed end of the sample tube.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. In particular, those skilled in the art will know how to make appropriate changes to the dimensions of the below-described closure consistent with the invention and needs of the user. Thus, it is intended that the present invention include modifications and variations that are within the scope of the appended claims and their equivalents.

Figure 1:
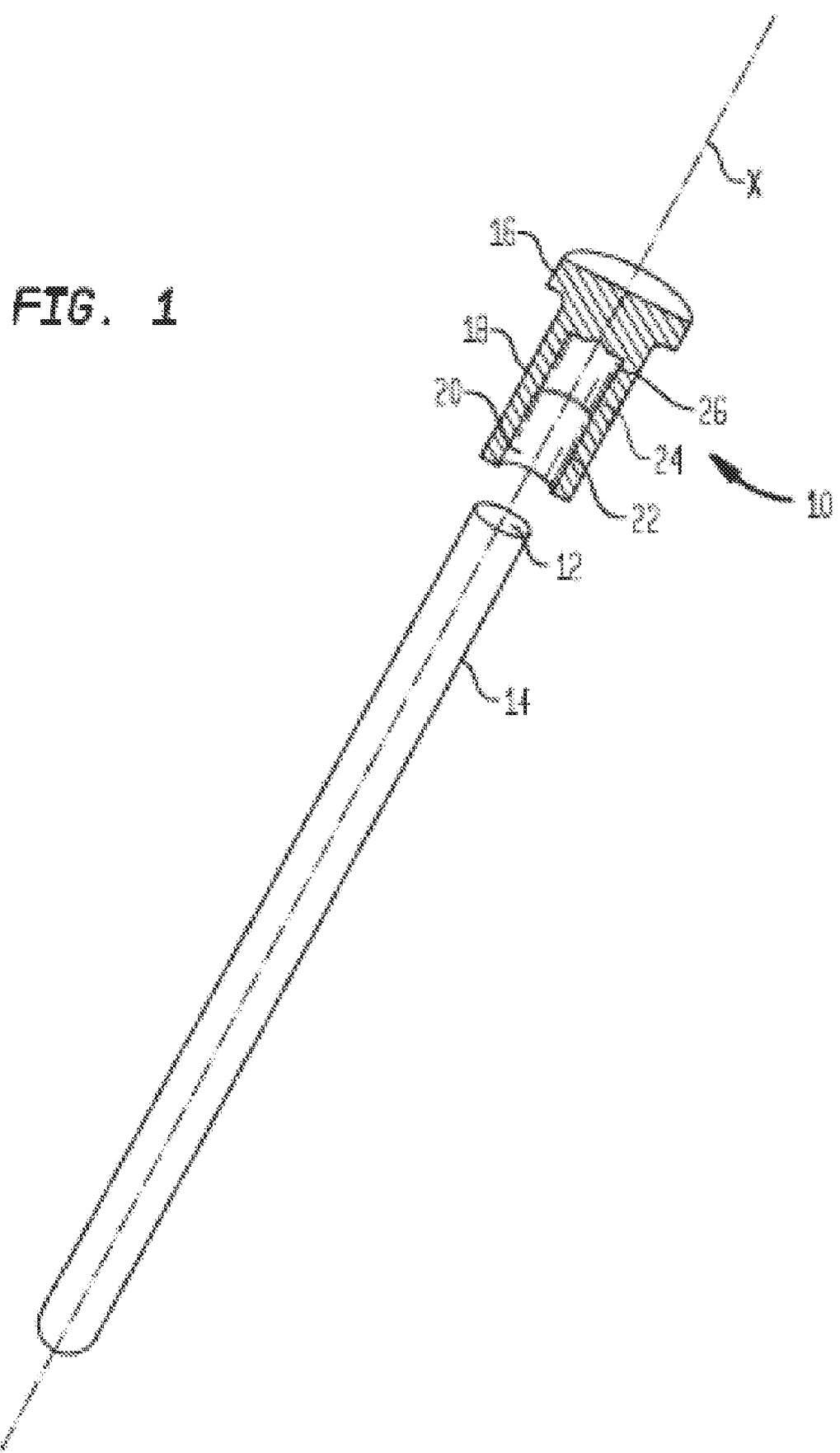
FIG. 1 is an exploded partial cross-sectional perspective view of one embodiment of the closure of the invention with an NMR sample tube.
Figure 2:
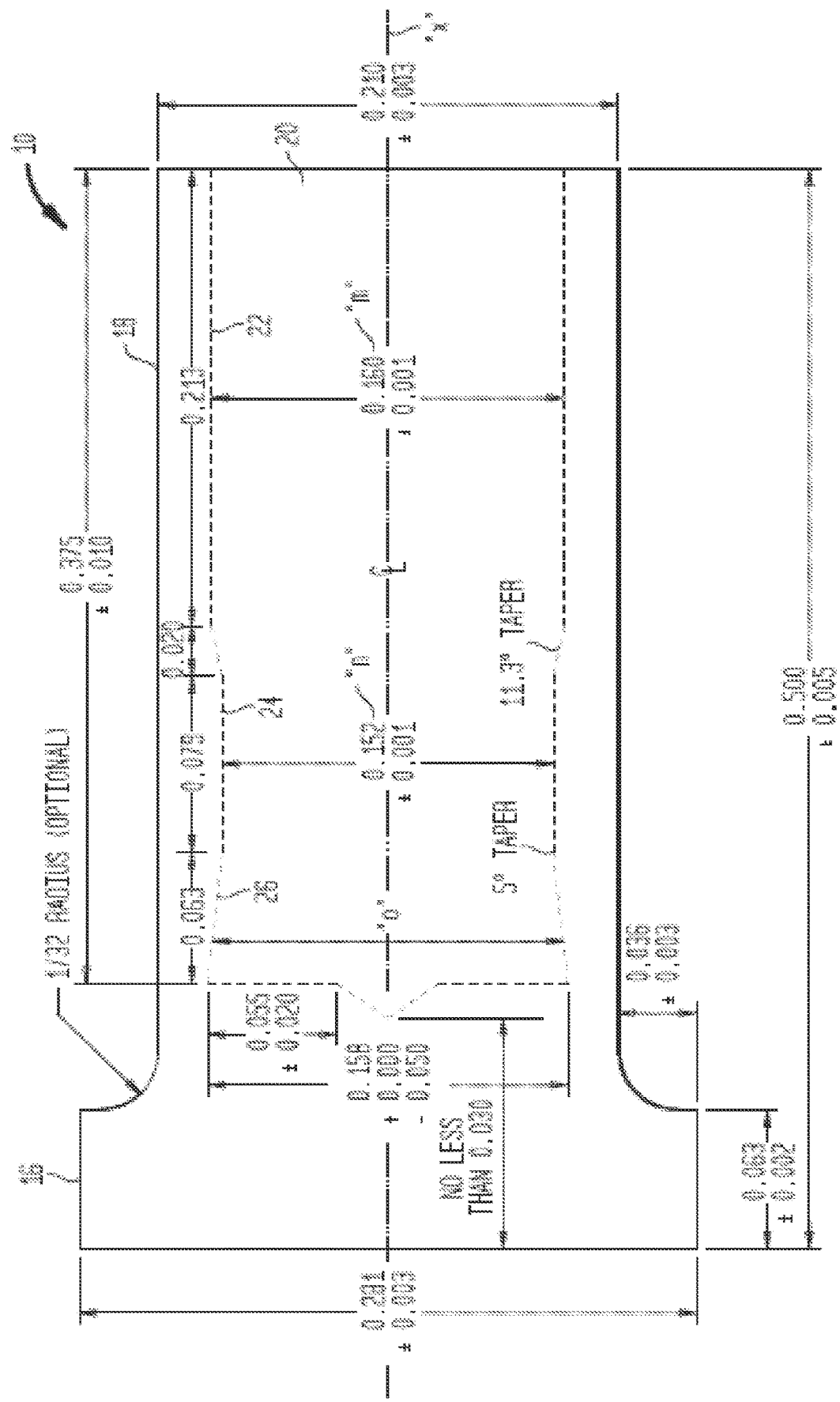
FIG. 2 is a cross-sectional view of an embodiment of the closure of the invention with dimensions appropriate for an NMR tube having a nominal 4 mm outside diameter.
Figure 3:
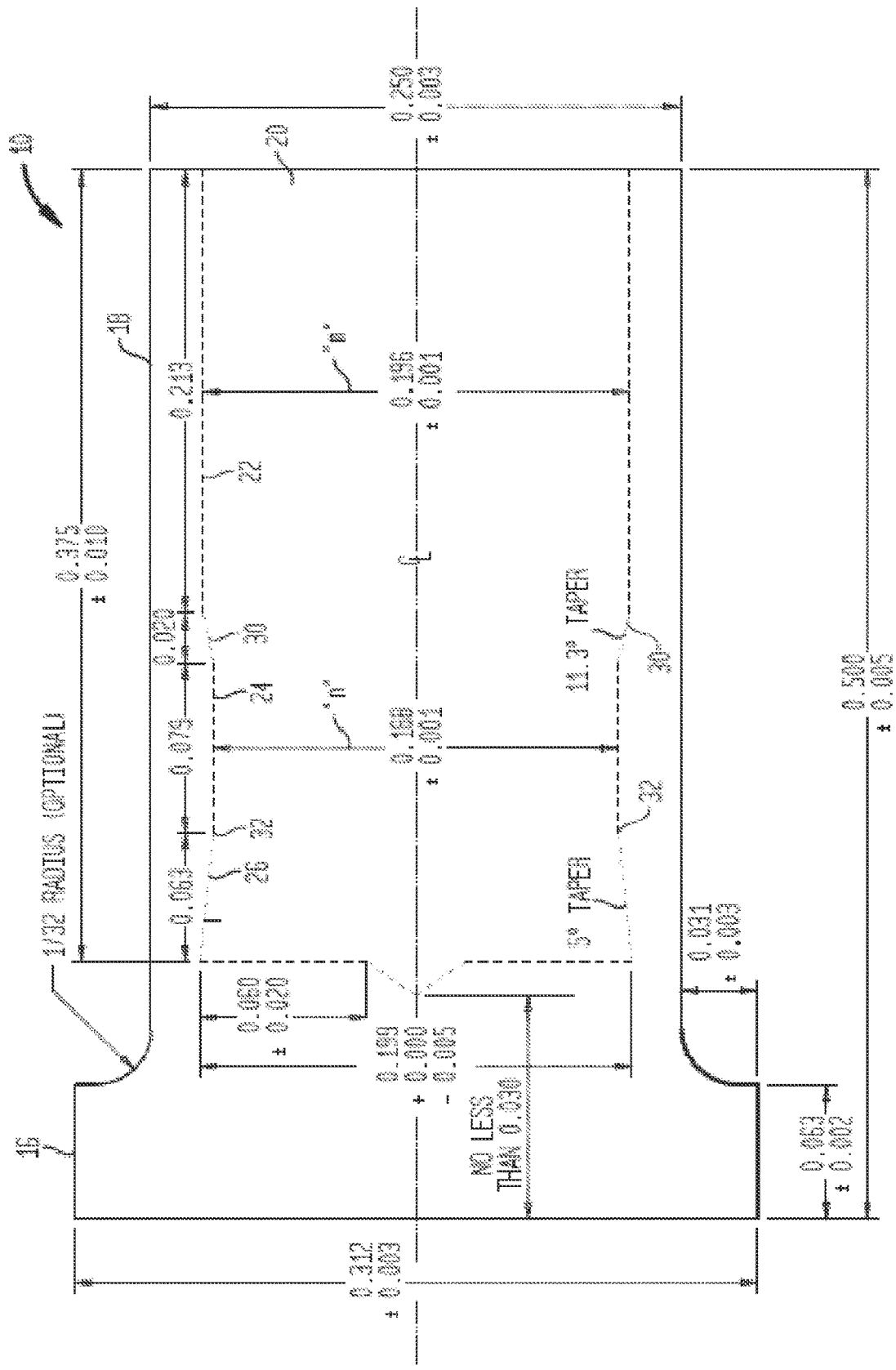
FIG. 3 is a cross-sectional view of an embodiment of the closure of the invention with dimensions appropriate for an NMR tube having a nominal 5 mm outside diameter.

Referring to FIGS. 1, 2 and 3, in one embodiment, a selectively removable closure 10 for closing an open end 12 of an NMR sample tube 14 includes a cylindrical proximal first portion 16 and a distal second portion 18. Both portions 16 and 18 are substantially congruent to a central axis "X". Second portion 18 has a hollow bore 20 extending therethrough. Hollow bore 20 has three sections, a distal section 22, a central section 24 and a proximal section 26. Distal section 22 has an inside diameter m, best seen in FIG. 3, that is sized to accept the outside diameter of a preselected size NMR sample tube substantially without an interference, e.g., when a 5 mm tube is selected, having an O.D. of about 4.95±0.013 mm, I.D. "m" is about 4.98±0.025 mm. Central section 24 is sized to provide a compliant interference fit with the outside diameter of the preselected NMR sample tube, e.g., for a 5 mm tube having an O.D. of about 4.95±0.013 mm, I.D. "n" is about 4.77±0.025 mm. Proximal section 26 is sized to accept the outside diameter of the preselected NMR sample tube, e.g. for a 5 mm tube having an O.D. of about 4.95±0.013 mm, I.D. "o" is about 5 mm. By having the several I.D. dimensions of sections 22, 24 and 26 as described above, when open end 12 of sample tube 14 is proximally axially inserted into closure 10, distal section 22 guides tube 14 into the closure, central section 24 provides a user perceptible resistance to passage of tube 14 and the movement of the tube into proximal section 26 allows the user to perceive a lessened resistance to the movement of the tube followed by seating open end 12 substantially adjacent first portion 16.

In some embodiments, second portion hollow bore central section 24 has an inside diameter sized to have an interference fit of between about 2% and about 8% relative to the outside diameter of NMR sample tube 14 when closure 10 is placed on open end 12 of the tube. Other interference fits which do not damage the sample tube can be used consistent with the invention. This interference fit serves to align tube 14 substantially coaxially with axis "X" of closure 10 and substantially optimally position the tube in the NMR sample chamber when closure 10 is being used to suspend the tube in the sample chamber.

In one embodiment, shown in FIG. 3, where closure 10 is sized for the 5 mm tube, a transition between distal section 22 and central section 24 of hollow bore 20 is a ramp 30 with a slope of between about 5° to about 15° relative to the distal section. In this embodiment, the transition 32 between central section 24 and proximal section 26 has a slope of between about −2° to about −5° relative to central section 24. Again, other transition dimensions which provide appropriate interference without damaging the sample tube can be used consistent with the invention. Yet other values for the transitions and the amount of interference fit may also be advantageously used for embodiments related to FIG. 8.

Figure 4:
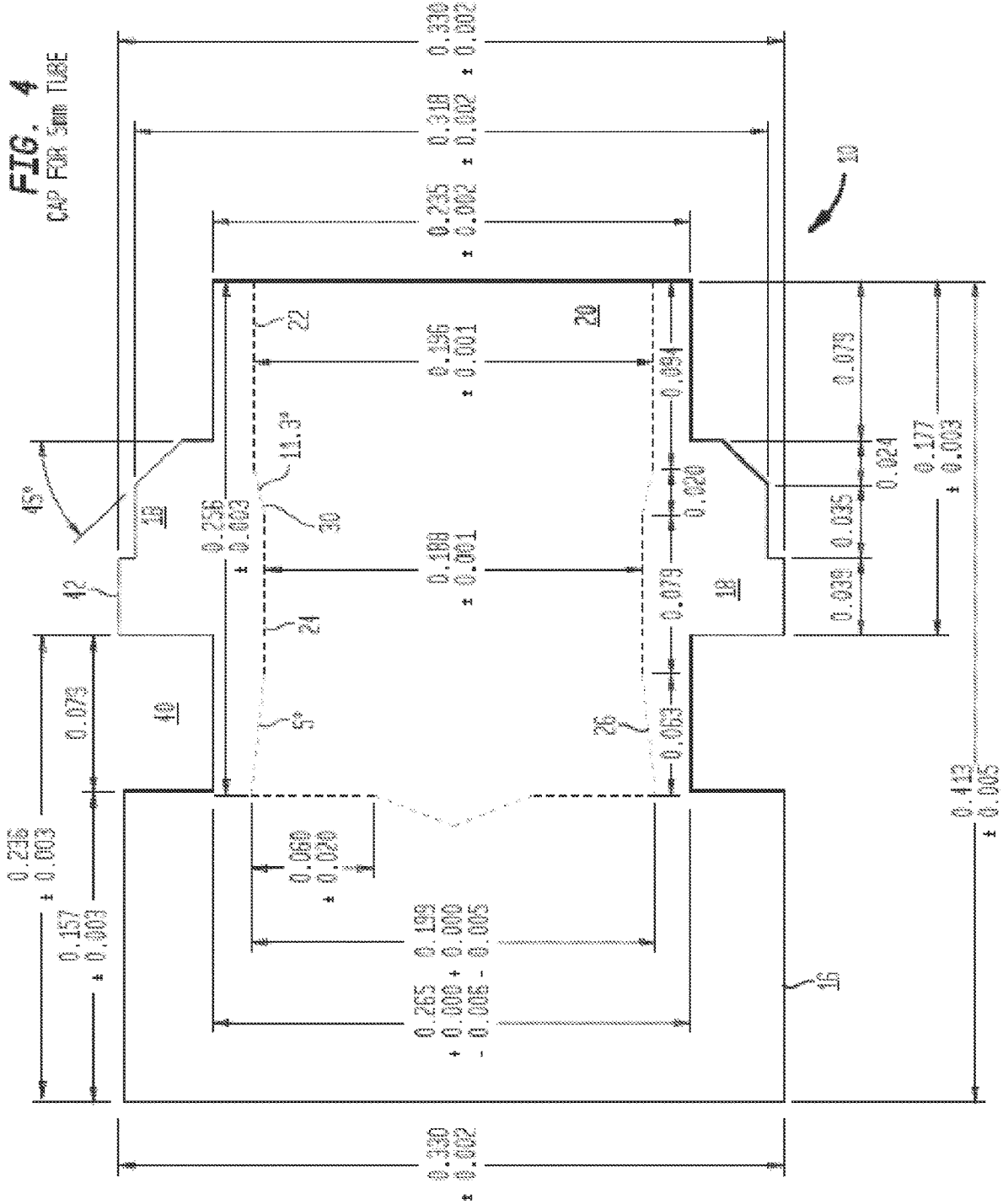
FIG. 4 is a cross-sectional view of another embodiment of the closure of the invention with dimensions appropriate for an NMR tube having a nominal 5 mm outside diameter.

In the embodiment illustrated in FIG. 3, first portion 16 has a larger outside diameter than second portion 18. In other embodiments, illustrated in FIGS. 4 and 5, first portion 16 and second portion 18 may have substantially the same outside diameters, with an additional structural feature such as one or more annular grooves 40 disposed substantially symmetrically to axis "X" along the outside diameter of closure 10. The distal second portion 18 of FIG. 4 has an expanded outside diameter portion 42.

Figure 6:
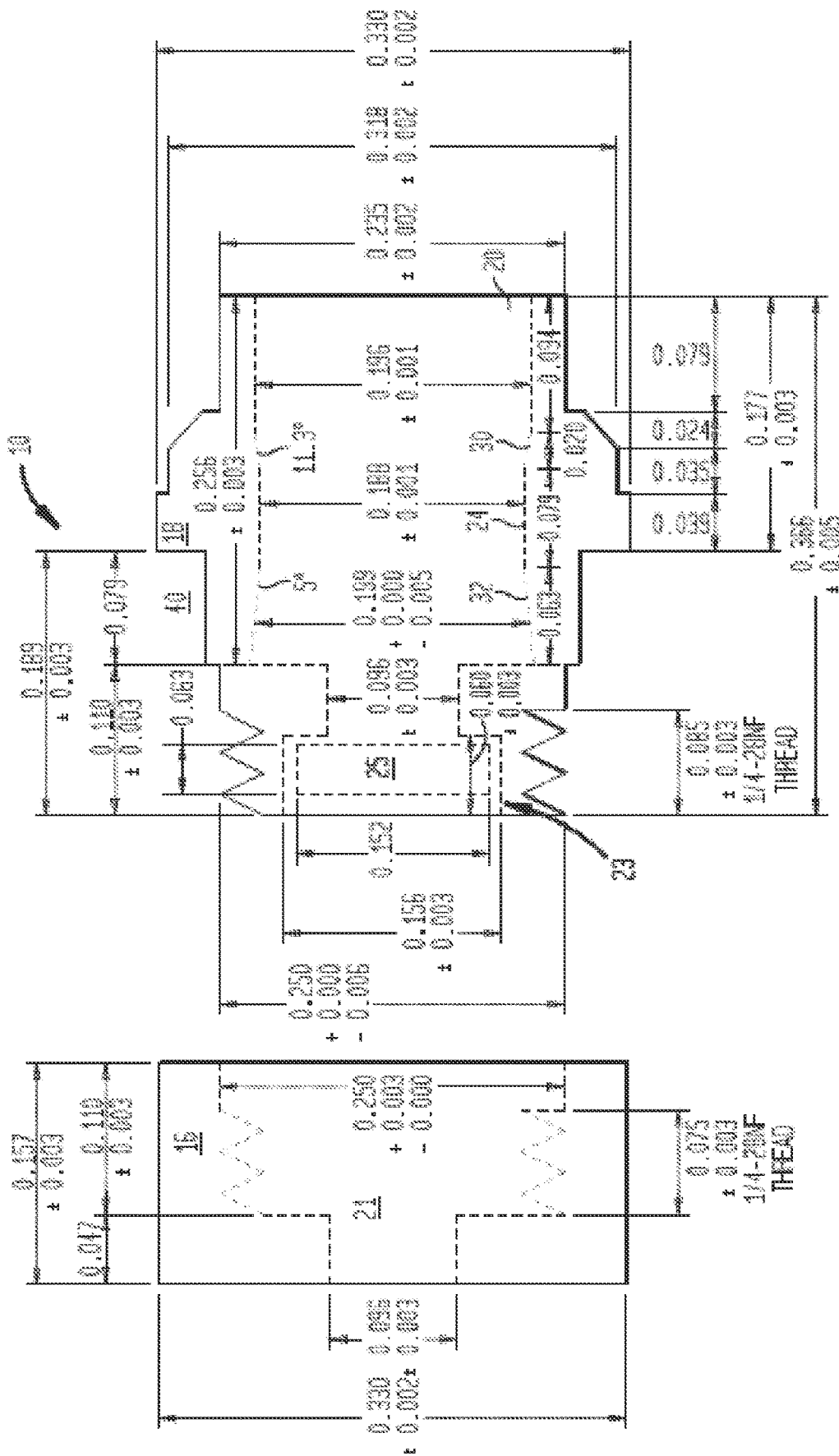
FIG. 6 is an exploded cross-sectional view of another embodiment of the closure of the invention with dimensions appropriate for an NMR tube having a nominal 5 mm outside diameter.

Referring to FIG. 6, in another embodiment of closure 10, first portion 16 and second portion 18 may have substantially the same outside diameters, but are individually formed as separate articles of manufacture. In this embodiment, first portion 16 has a hollow passage 21 therethrough disposed substantially coaxially with the "X" axis of closure 10 and is fluidly communicative with hollow bore 20 of the second portion when the first portion is attached to the second portion. In this embodiment, the attachment of first portion 16 to second portion 18 may be by cooperating threads, snap fit, press fit, adhesive bonding, solvent bonding, heat bonding, spin welding, sonic welding or other forms of forming releasable or fixed attachments as may be suitable for particular materials used to form the portions of closure 10. Additionally, as is shown in FIG. 6, there may be an enlargement 23 in either hollow passage 21, hollow bore 20, or partially in both passage 21 or bore 20 for accommodating a septum 25 formed from a resilient material that would occlude passage 21 and hollow bore 20, while allowing materials to be added or withdrawn from sample tube 14 by penetration of septum 25 by a penetrating element such as a syringe needle or an automated delivery device. Septum 25 is shown both adjacent to closure 10 and in phantom in enlargement 23. Suitable resilient materials for forming septum 25 include, but are not limited to, natural or synthetic rubber, silicone rubber, or the like, which will substantially reseal after a penetration. In some embodiments, septum 25 may include a slit, (not shown) to facilitate passage and withdrawal of the penetrating element. In this embodiment, the outside dimensions of first portion 16 and second portion 18 are constructed so as to produce groove 40 substantially symmetrically about axis "X" when the first and second portions are attached.

Figure 7:
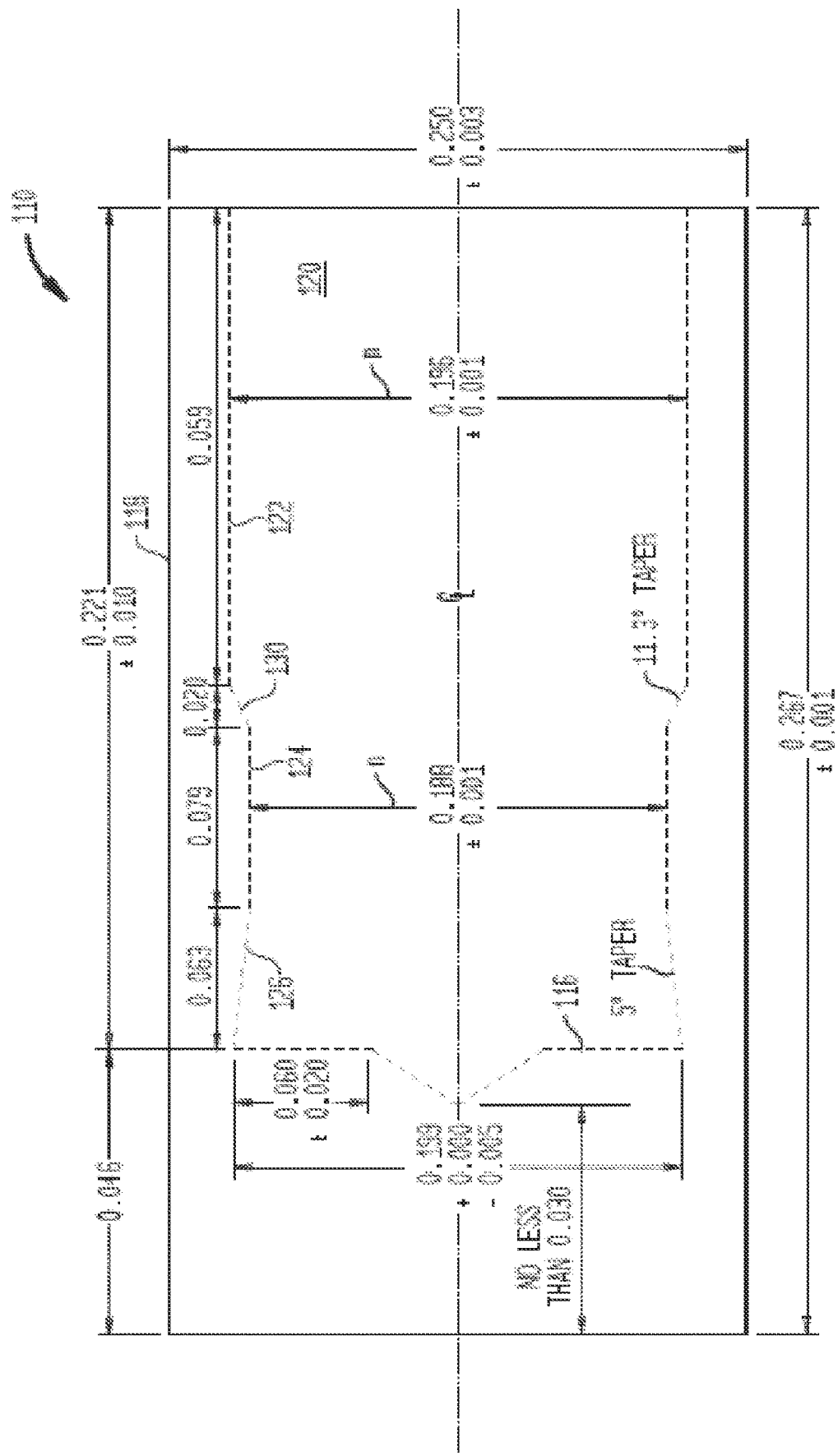
FIG. 7 is a cross-sectional view of another embodiment of the closure of the invention with dimensions appropriate for an NMR tube having a nominal 5 mm outside diameter.

FIG. 7 illustrates an embodiment of the closure of the invention that is dimensioned for compatibility with a robotic sampling device that utilizes a clamp mechanism that surrounds the cap, grasps it and then utilizes the cap to pick and place the tube. This embodiment, elements having similar structure and function of closure 10 in the embodiments illustration has reference numbers similar to those of FIGS. 1-6 except in the 100 series. Closure 110 has a proximal first portion 116 and a distal second portion 118. Closure 110 of the invention has a substantially uniform outside diameter over its length with a hollow bore 120 therethrough. Closure 110 has a distal section 122 with substantially no interference with the outside diameter of the preselected size tube. A ramp 130 connects distal section 122 to central section 124. Central section 124 has a similar interference fit to that of the embodiments described above and proximal section 126 provides the user with a perceptible reduced resistance movement for the tube to be seated substantially adjacent proximal first portion 116.

Figure 8:
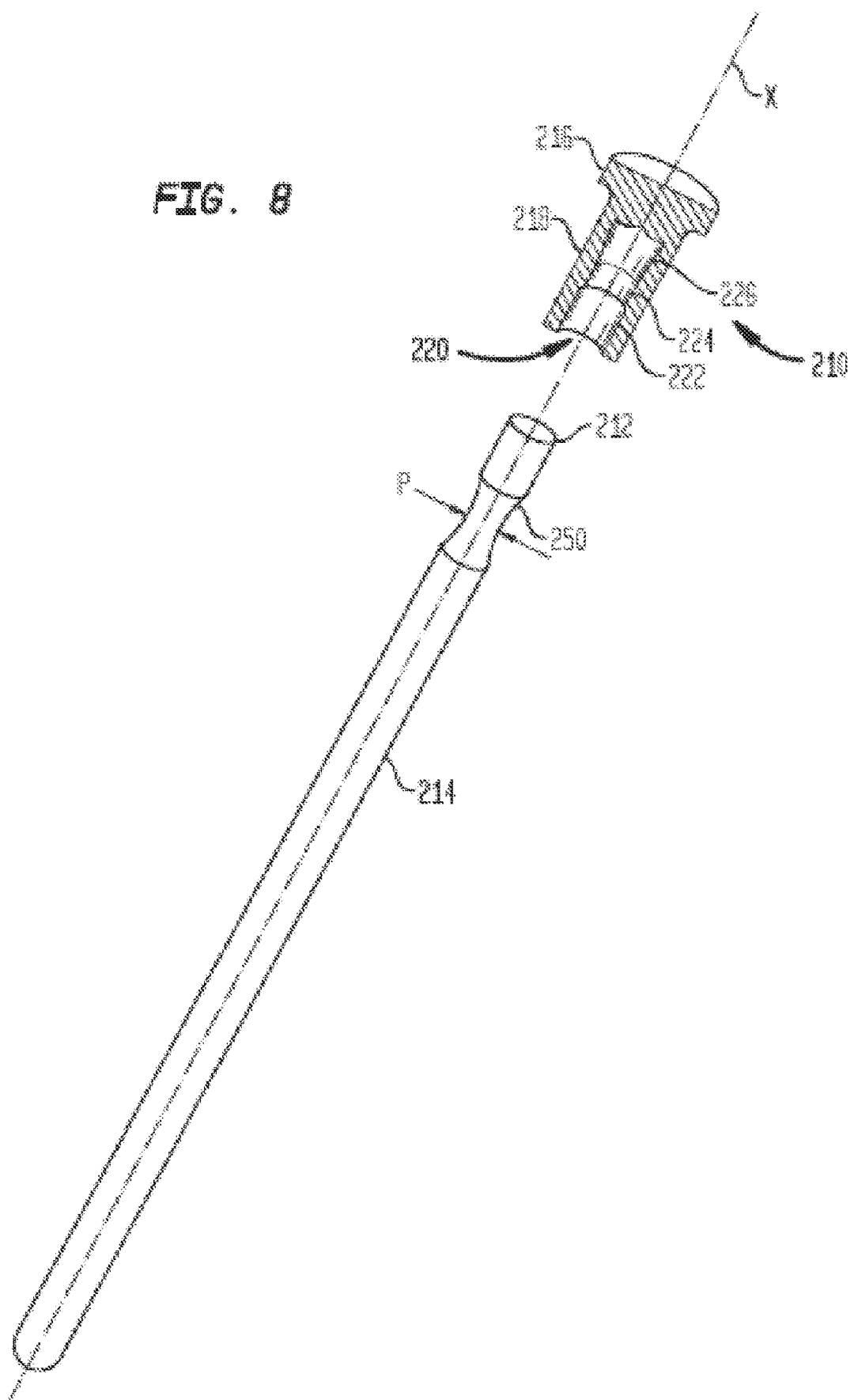
FIG. 8 is an exploded partial cross-sectional view of an embodiment of a sample tube system of the invention.

FIG. 8 illustrates an embodiment of the closure of the invention that cooperatively engages with an NMR sample tube to form a vessel and closure system. In this embodiment, elements having similar structure and function of closure 10 and sample tube 14 in the embodiments illustrated in FIGS. 1-6 are assigned similar reference numbers in the 200 series. A selectively removable closure 210 for closing an open end 212 of an NMR sample tube 214 includes a cylindrical proximal first portion 216 and a distal second portion 218. Both portions 216 and 218 are substantially congruent to a central axis "X". Second portion 218 has a hollow bore 220 extending therethrough. Hollow bore 220 has three sections, a distal section 222, a central section 224 and a proximal section 226. Distal section 222 has an inside diameter m, similar to that shown in FIGS. 1-3 for the closure 10, that is sized to accept the open end outside diameter of a preselected size NMR sample tube substantially without an interference, e.g., when a 5 mm tube is selected, having an O.D. of about 4.95±0.013 mm, I.D. "m" is about 4.98±0.025 mm. In the embodiment shown in FIG. 8, central section 224 is sized to provide a cooperative fit with a reduced outside diameter portion 250 disposed adjacent the open end 212 of an embodiment of preselected NMR sample tube 214 of the invention disposed to cooperate with central section 224 of closure 210 when the closure is fully engaged with sample tube 214 and open end 212 abuts proximal first portion 216 of the closure. In this embodiment, e.g., for a 5 mm tube having an O.D. of about 4.95±0.013 mm, I.D. "n" is about 4.77±0.025 mm, reduced outside diameter portion may have an O.D. "p" of about 4.77±0.025 mm so as to provide a nominal to slight interference fit as the open end of the tube with O.D of about 4.95±0.013 mm leaves the central section 224 and top portion 216.

As described above, reduced O.D. portion 250 of sample tube 214 is positioned to cooperate with central section 224. In order to cooperate with central section 224, a cross-sectional profile of reduced O.D. portion 250 is substantially a mirror image of the profile described for distal section, central section 24, ramp 30 and proximal section 26 in FIGS. 1-3 above. In the embodiments with reduced O.D. portion 250, the presence of the reduced O.D. of tube 214 will provide an interference fit at the lower end of the range expected for the interference fit between central section 24 and the O.D. of tube 14 of FIGS. 1-3 without the reduced O.D. section 250.

Proximal section 226 is sized to accept the outside diameter of the preselected NMR sample tube, e.g. for a 5 mm tube having an O.D. of about 4.95±0.013 mm, I.D. "o" is about 5 mm. By having the several I.D. dimensions of sections 222, 224 and 226 as described above, when open end 212 of sample tube 214 is proximally axially inserted into closure 210, distal section 222 guides tube 214 into the closure, central section 224 provides a user perceptible resistance to passage of tube 214 and the movement of open end 212 of tube 214 into proximal section 226 allows the user to perceive a lessened resistance to the movement of the tube as central section 224 cooperatively enters reduced outside diameter portion 250 of tube 214 followed by seating open end 212 substantially adjacent first portion 216. The particular dimensions and the interference relationships of reduced O.D. portion 250 and central section 224 advantageously may be adjusted for sizes other than the 5 mm tube used as an example. These other embodiments encompassing other dimensioned sample tubes and closures are to be considered within the scope of the present disclosure.

In some embodiments of the closure of the invention, the closure may be formed from a solid rod of a polymeric material such as polytetrafluoroethylene (PTFE) or other substantially chemically inert materials having similar properties. The use of PTFE as a material is facilitated by shaping the rod into the desired dimensions with a computer numerical controlled (CNC) automated lathe apparatus. Once the CNC apparatus is properly set-up, it can repeatedly efficiently produce the closure of the invention with a high degree of accuracy and precision. For other applications, injection molding techniques using other polymeric materials may be utilized, but many polymeric materials suitable for injection molding may not have the same degree of solvent resistance and dimensional stability as PTFE. Additionally, PTFE has sufficient resiliency that the closure will deflect sufficiently at central portion 24 to allow for some variation in NMR tube outside diameter. For example, tubes of European manufacture may have a slightly larger nominal outside diameter for a particular size than tubes manufactured in North America.

NMR tubes typically are formed from a vitreous material, generally various types of glass, e.g., soda-lime, borosilicate, quartz, and the like. In some applications, a polymeric material may also be used. Conventional closures are formed from polymeric materials that are more rigid than PTFE and, since these conventional tubes depend upon contact at the top of the tube to retain the closure onto the tube, the edge of the tube may remove material from the closure as tubes are repeatedly inserted into the closure, which reduces the ability of the closure to be retained on the tube. Closures 10, 110 and 210 of the invention substantially avoid this problem by having a resilient interference fit below the top of the tube and thus are not dependent on the tube end being perfectly formed to seal and retain the tube in the closure.

In the embodiment of the closure and tube system illustrated in FIG. 8, reduced O.D. portion 250 may be incorporated into tube 214 by application of sufficient heat to soften the area where it is desired to position reduced portion 250 while tube 214 is fixtured, thereby causing a narrowing of the tubing. In some embodiments, this procedure may be advantageously conducted before tube 214 is cut to its final length. Alternatively, sufficient heat may be applied to tube 214 while the tube is mounted in a lathe, and a tool, such a heated metal device or a graphite rod or paddle may be applied to the heated tube while it is rotating to achieve the desired shape of reduced O.D. portion 250.

A further benefit of the embodiments of the invention is that nominal four inch tubes designed for use in automated sample handling devices of different manufacturers are actually produced in a separate length for each manufacturer using their specific conventional closures. One manufacturer may supply tubes with closures thereon having an overall length of 105.8±0.5 mm, while another may supply tubes with closures thereon having an overall length of 107.5±0.2 mm. With the embodiments of the closures of the present invention, a standardized overall tube length of 103.5±0.2 mm may be used, with the embodiments of the closure of the present invention providing the compatible overall length for use with current automated handling systems and NMR spectrometers.

In the embodiment of the closure and tube system illustrated in FIG. 8, reduced O.D. portion 250 may be incorporated into tube 214 by application of sufficient heat to soften the area where it is desired to position reduced portion 250 while tube 214 is fixtured, thereby causing a narrowing of the tubing. In some embodiments, this procedure may be advantageously conducted before tube 214 is cut to its final length. Alternatively, sufficient heat may be applied to tube 214 while the tube is mounted in a lathe, and a tool, such a heated metal device or a graphite rod or paddle may be applied to the heated tube while it is rotating to achieve the desired shape of reduced O.D. portion 250.

A further benefit of the embodiments of the invention is that nominal four inch tubes designed for use in automated sample handling devices of different manufacturers are actually produced in a separate length for each manufacturer using their specific conventional closures. One manufacturer may supply tubes with closures thereon having an overall length of 105.8±0.5 mm, while another may supply tubes with closures thereon having an overall length of 107.5±0.2 mm. With the embodiments of the closures of the present invention, a standardized overall tube length of 103.5±0.2 mm may be used, with the embodiments of the closure of the present invention providing the compatible overall length for use with current automated handling systems and NMR spectrometers.

Embodiments of closures or caps and NMR tubes as described before may be marketed as NorLoc™ Caps and Norell® NMR Tubes. A description of these enclosures, caps and related NMR tubes can be found in U.S. Pat. No. 8,054,080 to Norell issued on Nov. 8, 2011, which is incorporated herein by reference in its entirety.

A further improvement of an NMR cap design is provided next as an embodiment of the present invention. In addition to the elements described above and in accordance with an aspect of the present invention an internal sealing band or constriction is added that also functions as a locking or retaining element when used in conjunction with specially modified NMR tubes. This new feature is called the "secondary locking seal" hereafter.

The new "secondary locking seal" cap also works with unmodified NMR tubes, however, without offering the further benefits of the "secondary locking seal." The NMR tubes may be specially modified versions of an NMR tube as disclosed earlier herein, by adding and accurately positioning a band of a defined thickness around the outer diameter of the NMR tube. The band may be a band or ridge of material that is added on a predetermined position partially or completely around the circumference of the NMR tube. The band may surround the outer diameter of the NMR tube completely or it may surround it partially.

In one embodiment of the present invention, the band may also surround the outer diameter of the NMR tube partially, leaving at least one part of the circumference of the NMR tube uncovered. In a further embodiment of the present invention the band is attached around the NMR tube with at least two breaks or parts of the NMR tube being uncovered.

Accordingly, one can modify already manufactured NMR tubes by adding a band, preferably by a machine with high precision and a high throughput, to NMR tubes, to enhance use of caps with a "secondary locking seal" as described further below. The band has a thickness that is appropriate to work as a seal in combination with one or more added features in the cap.

In accordance with an embodiment of the present invention, a system solution is provided for a combined NMR tube with cap with "secondary locking seal" wherein a permanent feature is added to the NMR tube that is a surrounding ridge or band of material around the exterior of the NMR tube at a predefined location of the NMR tube. In accordance with an aspect of the present invention a band is printed, by for instance screen printing, on the NMR tube. The NMR tube may already have been provided with some pre-printed feature that is used to align the NMR tube for very precise location to print the desired band. To prevent overlap of printed ink, a small gap may be left between the two ends of the band. Ink that is used may be of any type that can strongly adhere to glass. In some embodiments, a two component epoxy based screen printing ink may be used. By way of non-limiting example, any ink and catalyst in the Enthone 50-Series CAT-L-INK Technical data sheet issued Jan. 30, 2008, may be used. The Enthone 50-Series CAT-L-INK Technical data sheet issued Jan. 30, 2008, is herein incorporated by reference in its entirety.

The printed band may have a thickness that is proportional or the same as a silk screen used to deposit the material. In one or more embodiments, the thickness of the material deposited on the NMR tube may be in the range of 0.0002 to 0.0014 inches thick. In other embodiments, the material deposited on the NMR tube may be 0.00025 inches thick.

The band may have a width in the range of 0.005 to 0.180 inches. In other embodiments, the band of material may have a width of 0.028 inches. In yet other embodiments, the band may have a width of 0.028 inches centered at a distance of 0.144 inches from the open end of an NMR tube, the locking ring partially encircling the NMR tube, having one discontinuous segment, and one continuous segment having one or more linear lengths of 0.512 inches or 0.315 inches.

In one or more embodiments, the pattern of the printed band may be discontinuous, consisting of segmented lines or bands having 1, 2, 3 or more breaks or discontinuities. In one or more embodiments, the lengths of the discontinuous regions can range from 0.005 to 0.303 inches. In other embodiments, the printed band may consist of round, square or rectangular "dots" or other geometric shapes of varying size, in the range of 0.005 to 0.180 inches, separated by distances in the range of about 0.005 to 0.303 inches. In one embodiment, the printed band is mostly continuous, having only one break or discontinuity of about 0.103 inches in length.

Printing by way of screen printing of the band on the NMR tube is known and relatively inexpensive and fast. However, other methods of depositing a band on the outside of the NMR tube are also contemplated, including the application of pre-made decals supplied by, for example, Pedco-Hill, Inc. in Warminster, Pa. 18974. Pre-made decals can be affixed to glass surfaces by first moistening the decal with water, positioning the decal on the glass surface, allowing the decal to air dry followed by permanently fusing the decal to the glass surface by heating at about 1000° F.

Figure 9:
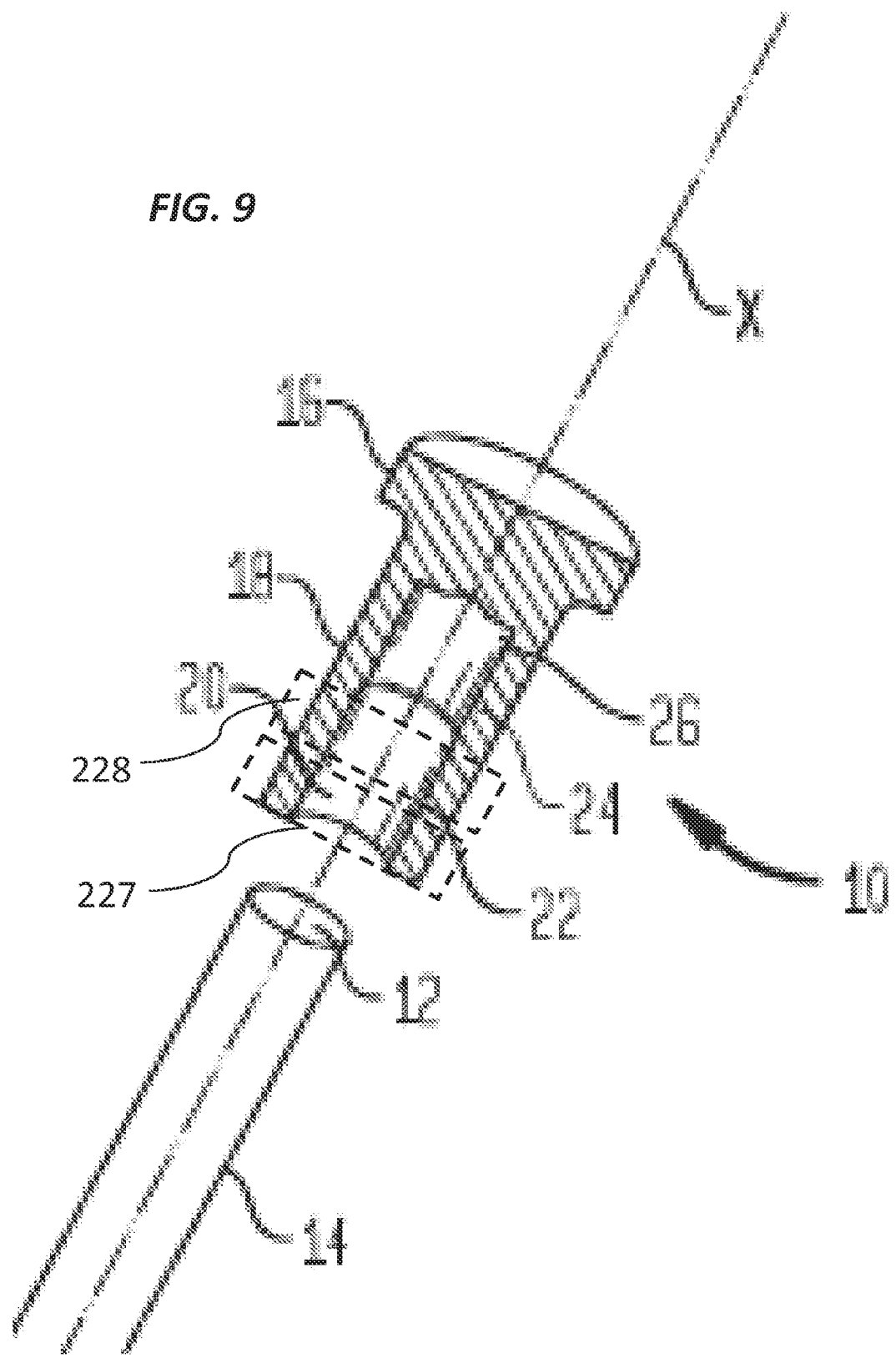
FIG. 9 is a cross-sectional view of an embodiment of the closure that identifies a location of the first and the second distal section.

Referring to FIG. 9, the secondary locking seal is added into the distal section 22 of the hollow bore 20 at a sufficient distance within to leave a remainder of distal section 22 intact at the immediate entrance to hollow bore 20. This is illustrated in FIG. 9 wherein first distal section 227 will be modified to add the secondary locking seal and second distal section 228 will be left unmodified. First distal section 227 and second distal section 228 together form distal section 22. This is further illustrated in FIGS. 10 and 11. One can see that first distal section 227 has been provided with a tapered opening, wherein the inside diameter of the enclosure 10 diminishes when viewed from the beginning of the opening moving to interference 24 and proximal end 26. FIG. 11 shows first distal section 227 in greater detail marked as "Detail C".

Though, in one or more embodiments, the length of distal section 22 has been reduced to a range of 0.008 to 0.025 inches, and in other embodiments may be reduced to a length of 0.015 inches, it nevertheless remains discernible to the end user as a functional element, guiding and aligning the NMR tube into hollow bore 20 when placing a newly designed and structured NorLoc™ cap onto the NMR tube, thereby incorporating the inventive features. The secondary locking seal is preferably located within the new NorLoc™ cap at the point of maximum flexibility, i.e., at the point of minimum wall thickness found at the extreme end of the distal second portion 18 that is opposite to the proximal first portion 16, and away from any restraining or reinforcing features such as the closed end of proximal first section 16.

The first distal section 227 transitions into second distal section 228 with a relatively sharp ramp 230. The angle of ramp 230 with a normal onto a straight wall of the outside of the NMR tube or an angle with a line parallel to axis X as shown in FIG. 1 is preferably as close as possible to being perpendicular or 90 degrees. For some purposes, such as manufacturing a 90 degree angle may not be possible. More preferably is an angle of 85 degrees or greater. Most preferably is an angle of the ramp that is not smaller than 75 degrees. This allows the first distal section 227 of the enclosure to capture or hook with the ramp 230 the locking ring 123.

The increased flexibility of the cap at this point permits the secondary locking seal to fit over the corresponding NMR tube diameter much more tightly (in other words, the inside diameter of the secondary locking seal within the cap can be made much smaller) and still allows the end user to easily place the cap onto the NMR tube. For example, the inside diameter of the secondary locking seal in a 5 mm cap can be reduced to 4.50 mm-4.78 mm and still easily slip onto a 5 mm NMR tube of nominal 4.97 mm outside diameter.

As a further result, the inside diameter of the cap within the central section 24 of hollow bore 20, exhibiting a compliant interference fit that constitutes the primary seal, can be enlarged slightly, thereby alleviating the sometimes difficult process of applying or removing the cap experienced by some end users. In summary, this embodiment of the NMR cap seals even more effectively than the design provided earlier above while increasing ease of use.

To further safeguard the integrity of the assembled cap and NMR tube combination, a special element can be added to the NMR tube, consisting of a screen printed band or ring encircling the outside circumference of the NMR tube, hereafter referred to as the "locking ring" as already described above. See element 123 in FIG. 12.

Figure 12:
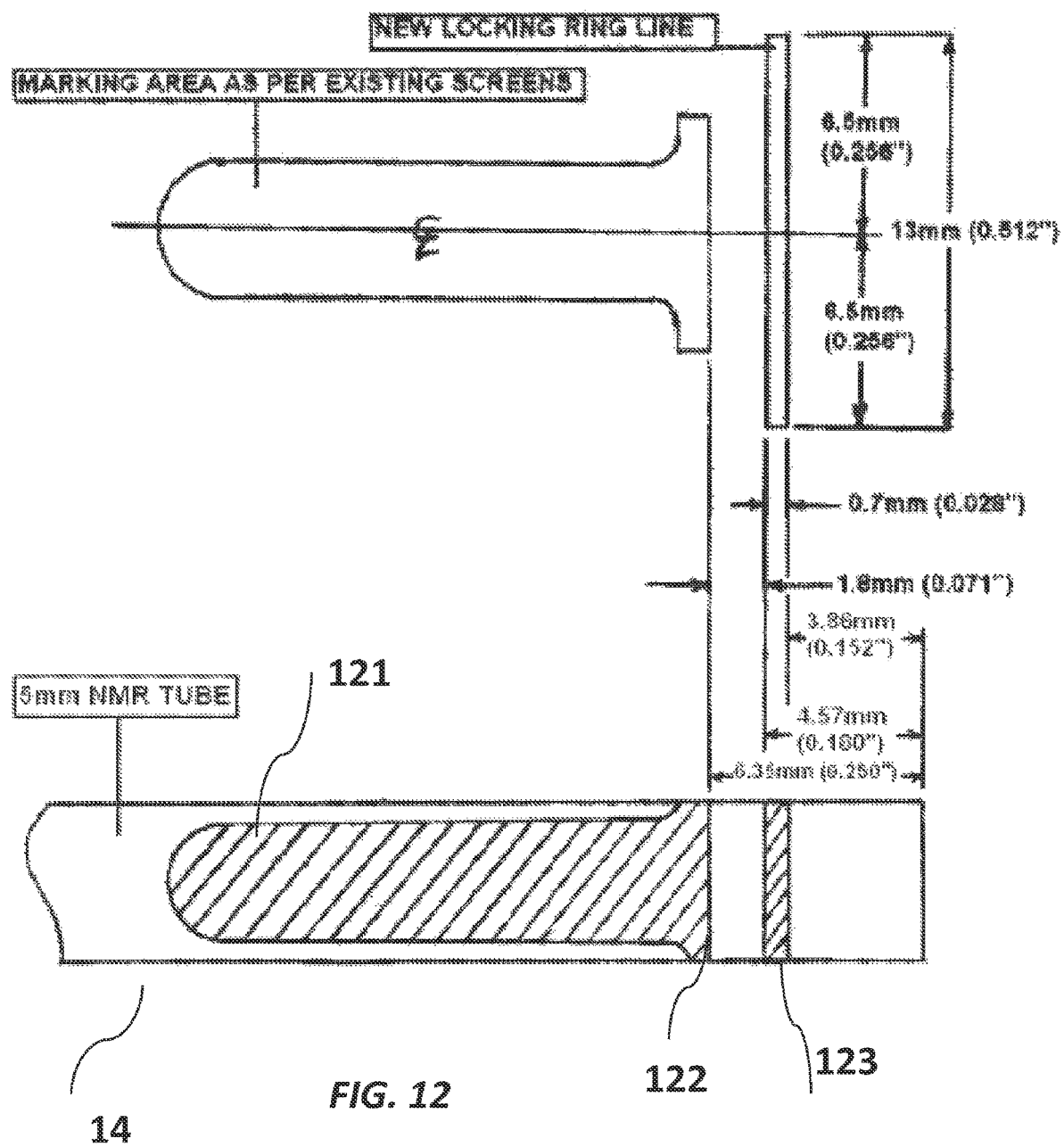
FIG. 12 illustrates the NMR sample tube with a marking area and a locking ring in accordance with an aspect of the present invention.

FIG. 12 illustrates an NMR tube 14 in one embodiment of the present invention. A marking area 121 is reserved for printing or marking the tube with relevant information. Part of the marking is a straight area 122 across the width of the NMR tube that marks a specific height of the NMR tube when placed in a vertical orientation. Because the line 122 is exactly defined it is possible to print the locking ring 123 on a predefined distance from 122. Exact positioning is of an NMR tube is important, as one wants the feature 230 in the cap to correspond with the locking ring 123 on the NMR tube.

Referring to FIG. 11, the sharp innermost (or proximal) edge of ramp 230 of the secondary locking seal has a nearly perpendicular profile to the central axis X through hollow bore 20, and so can engage the raised screen printed edge of the locking ring on the NMR tube as it passes over and beyond the locking ring upon proper cap placement, thereby adding additional resistance to cap removal.

In contrast, the outermost (or distal) edge 231 of the secondary locking seal within the cap has a gently tapered profile, offering minimal resistance to cap placement by virtue of the gently tapered surface encountered by the locking ring during cap placement.

The locking ring must be precisely positioned at the correct distance from the open end of the NMR tube to fulfill its purpose, and when the cap is correctly placed on the NMR tube, the locking ring is not visible, but is hidden within the cap. For this reason, the adjacent marking area or label patch 121 also is a structure that has a functional purpose in addition to what might be considered merely decorative or aesthetic markings. The end of the marking area 122 adjacent to the open end of the NMR tube has been specially designed into a straight band or line that fully or partially encircles the NMR tube, forming a reference line that indicates full and correct placement of the cap when the base of the cap contacts the reference line. At this point, the locking ring, hidden from view within the cap, will also be positioned correctly in relation to the cap to properly engage the proximal edge of the secondary locking seal within the cap.

In order for these new screen printed features to work effectively, the print screens must be accurately made and the image precisely printed on the NMR tube to maintain accurate positioning of the marking area in relation to the locking ring, which in turn must be accurately positioned relative to the open end of the NMR tube in FIG. 12.

Purpose and Benefits

The design of the cap, as provided earlier above, having only the primary seal formed by the compliant interference fit of central section 24, sealed and contained most common NMR solvents very effectively, including highly volatile solvents such as acetone-d6 or chloroform-d. However, the tight but effective seal also may cause difficulty for some end users, especially when attempting to remove the cap. Ambient temperatures below normal room temperature may further aggravate and compound this difficulty.

In an effort to ease potential difficulties in the process of cap removal, the inner diameter of the cap within the central section 24 of hollow bore 20 is enlarged. This change eases cap placement and removal, but another problem may arise as a result of this change.

After a few hours of exposure to certain solvents contained within the NMR tube, primarily chlorinated solvents such as chloroform or dichloromethane (methylene chloride) and to a lesser extent acetone, the solvent vapors could permeate into the polyethylene polymer material of the cap and swell or enlarge the cap to a slight degree, which may cause a nearly complete loss of retention of the cap to NMR tubes having an outer diameter near the lower end of the size range.

This is a deficiency common to polyethylene resins in general (including low density polyethylene, or LDPE, that is used to make caps) and can result in separation of the cap from the NMR tube, especially during, but not limited to, unattended NMR analyses of multiple samples conducted using automated robotic sample handling systems that handle samples by means of the cap only, and not by the NMR tube. This type of cap failure can cause expensive NMR instrument damage as well as loss of expensive samples, such as certain natural products that require extensive effort to collect and concentrate a sufficient, but very limited amount, of pure sample for analysis.

It was found that the amount of swelling or enlargement of the diameter of a 5 mm cap may be about 0.13 mm at maximum, reaching an equilibrium, or steady state, upon prolonged exposure to the solvent vapors. As solvent vapors permeate into and then saturate the polyethylene polymer, a steady state condition eventually occurs when solvent vapors begin to permeate completely through the cap to the exterior and escape from the system, thereby effectively limiting the amount of absorbed solvent vapor and consequent further swelling or enlargement of the polyethylene polymer.

This is a purely physical (not a chemical) and completely reversible process. The chlorinated solvents and acetone mentioned earlier, as well as most other common NMR solvents, do not chemically react with polyethylene, causing polymer modification or degradation, but rather, upon cessation of exposure to solvent vapor, the vapor previously absorbed into the polyethylene cap material is eventually completely expelled. This process can be hastened by gentle heating, especially in a vacuum oven at reduced pressure, restoring the cap to its original size and condition.

However, because of the many otherwise outstanding attributes of low density polyethylene (LDPE) that may be used to make a cap, it remains a material of choice for NMR tube caps and other closures of all kinds, not only because of its inherent optimum degree of flexibility and elasticity, but also because LDPE possesses excellent resistance to chemical degradation and attack, is low in cost and can be easily and accurately injection molded in large quantities.

The positive aspects of LDPE remain so attractive, in fact, that the susceptibility to chlorinated solvents is largely tolerated or circumvented by most NMR spectroscopists by limiting the exposure time, replacing the exposed caps with new ones immediately prior to analysis in the NMR instrument and/or using a much more expensive cap material such as PTFE (polytetrafluoroethylene) as recommended in the industry. These restrictive measures still constitute a stumbling block for many NMR end users, however, so a permanent remedy would be widely appreciated.

Figure 5:
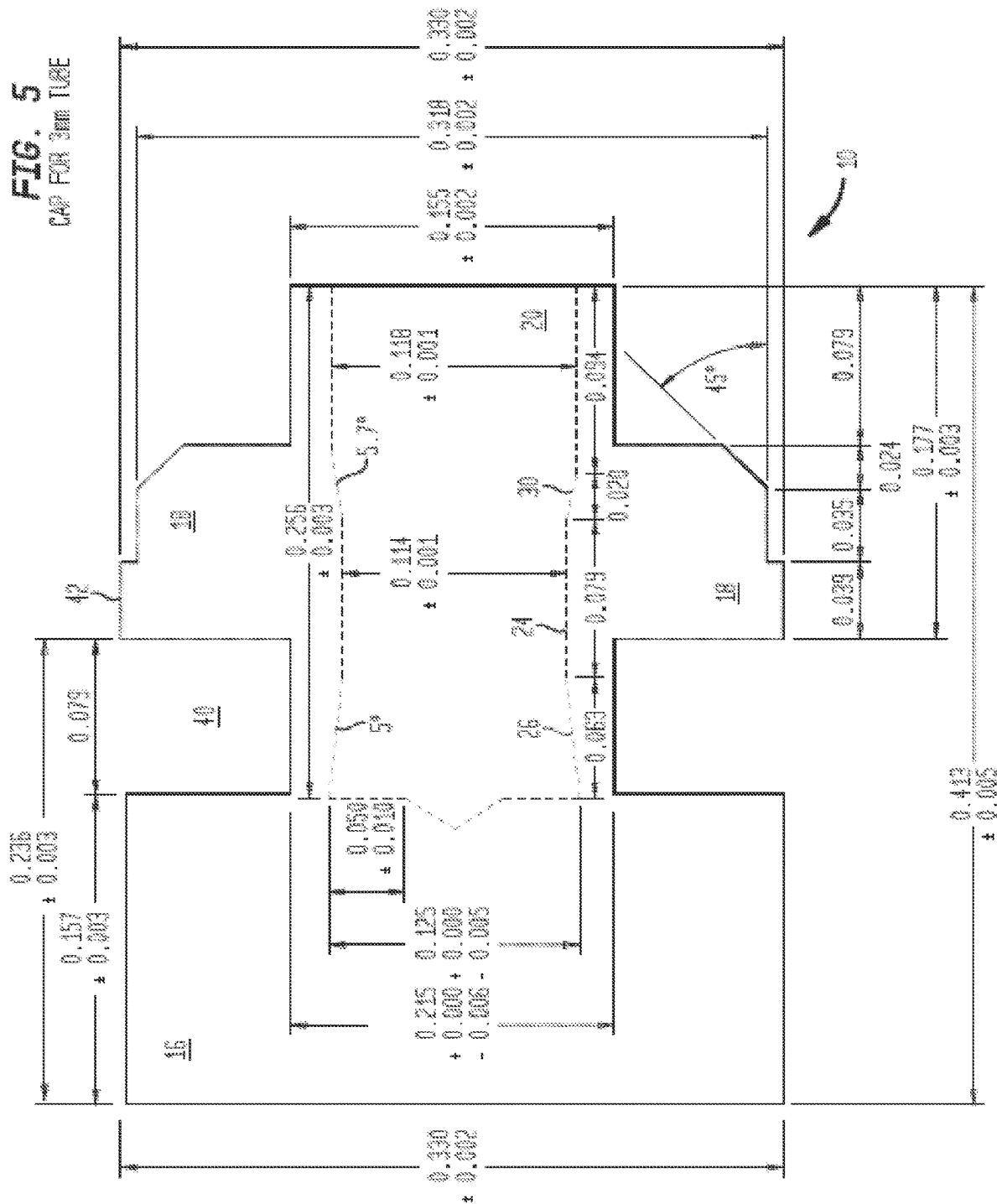
FIG. 5 is a cross-sectional view of another embodiment of the closure of the invention with dimensions appropriate for an NMR tube having a nominal 3 mm outside diameter.
Figure 10:
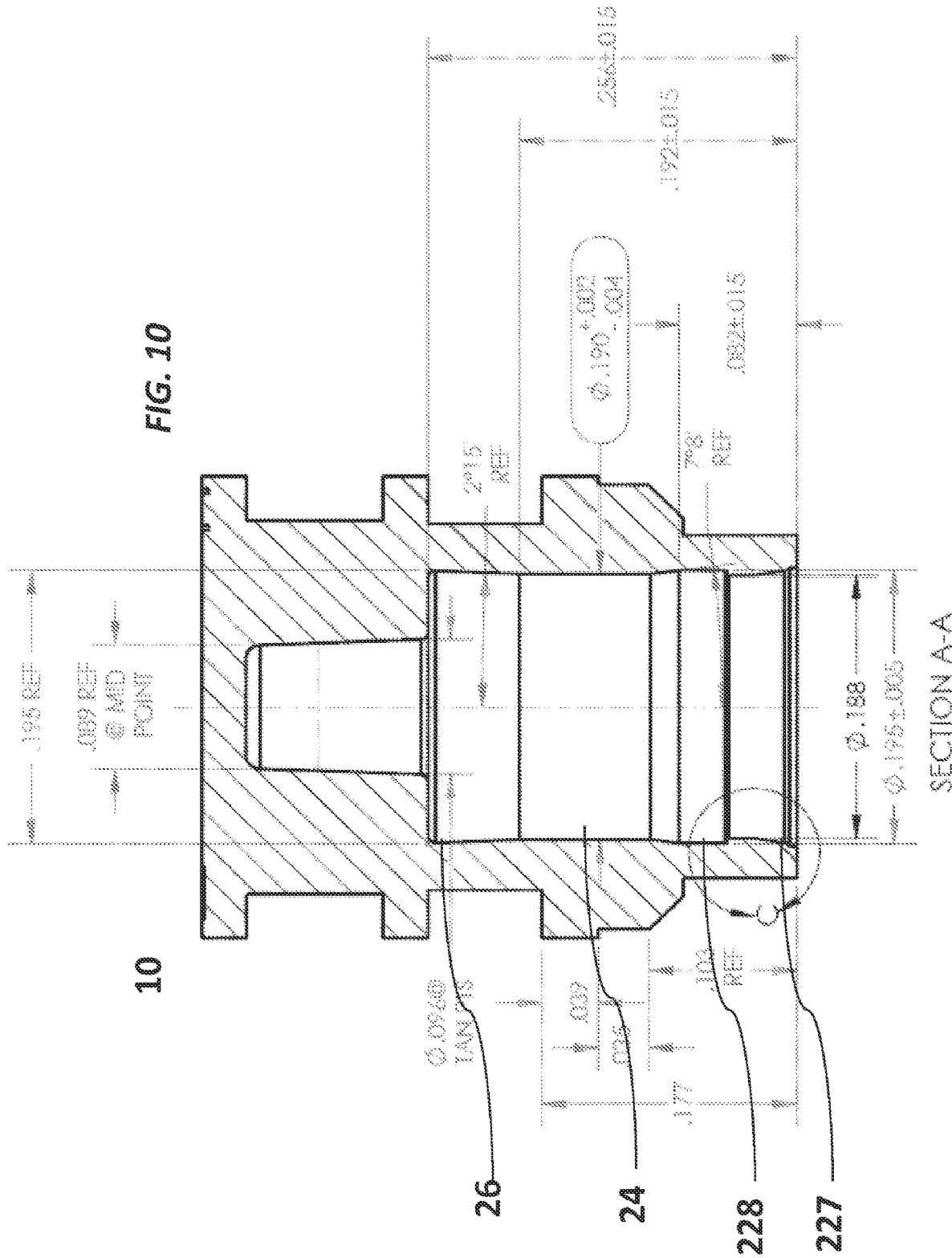
FIG. 10 is a cross-sectional view of an embodiment of the closure with a secondary locking seal in accordance with an aspect of the present invention.
Figure 11:
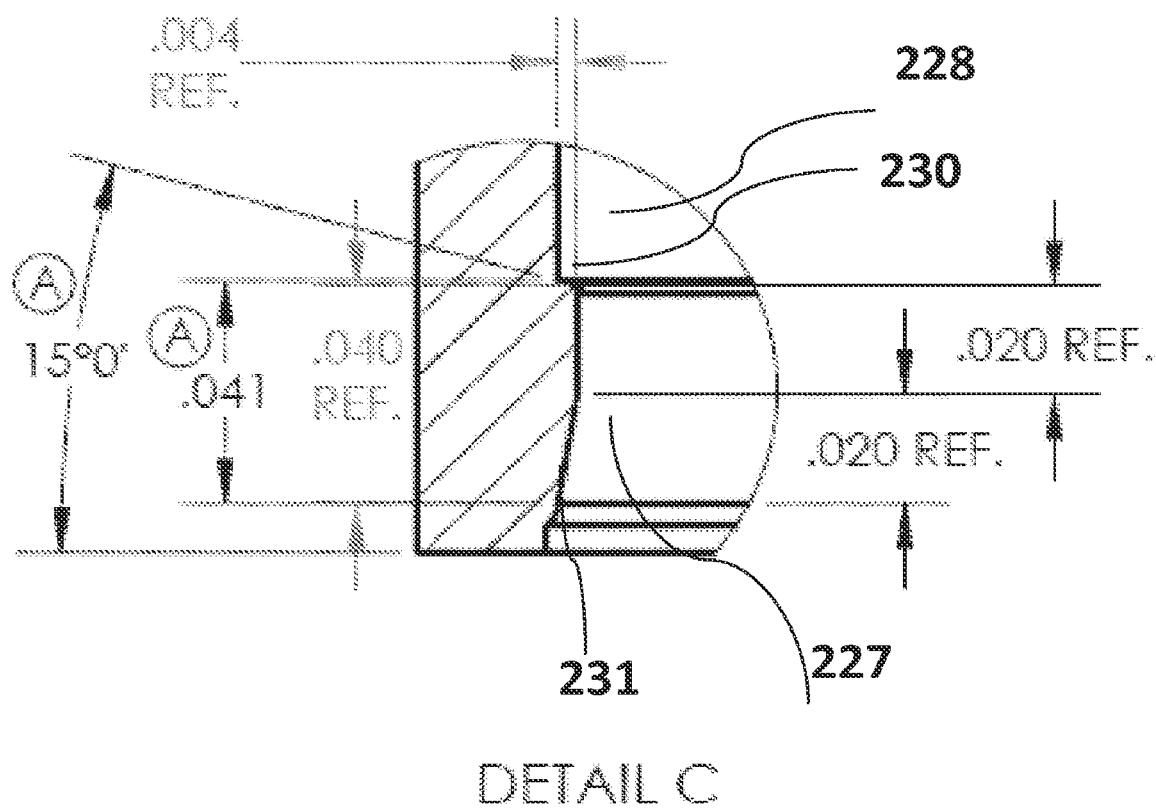
FIG. 11 is a detailed illustration of a part of the enclosure of FIG. 10.

The addition of the secondary locking seal as illustrated in FIGS. 10-11 augments the sealing function of the compliant interference fit of central section 24 of hollow bore 20 in the cap provided as for instance illustrated in FIG. 5. It also permits a lessened amount of interference to be incorporated into central section 24, thereby improving safety and ease of use by reducing the amount of effort required to fit or remove the cap to and from the glass NMR tube, while simultaneously preserving and enhancing the barrier function of the earlier design of the cap provided herein by preventing loss of expensive NMR samples and solvents due to evaporation from within the sample, or ingress of ambient contaminants such as atmospheric moisture and oxygen from without. The interference can be lessened by about 0.002 inches.

The tighter fitting, decreased inner diameter of the secondary locking seal, made possible by virtue of its placement within the most flexible portion of the cap, as explained previously, leaves ample margin to counteract the loss of retention of the cap to the NMR tube, caused by expansion or swelling of the polyethylene cap material (LDPE) when exposed to certain, primarily chlorinated, NMR solvents, but without sacrificing ease of placement and removal from the NMR tube.

The above mentioned benefits of this new design of the cap can be realized in combination with most conventional NMR tubes of matching nominal diameter. However, using the new caps in combination with specially designed and precisely screen printed NMR tubes having the new locking ring element as illustrated in FIG. 12 adds a measure of additional physical cap restraint, increasing reliability by safeguarding against cap and NMR tube separation when used in potentially high stress applications, such as unattended robotic sample transfer and handling of multiple samples containing even problematic chlorinated solvents. For instance, deuterium labeled (also known as stable isotope labeled) solvents commonly used in NMR spectroscopy, including, but not limited to, chloroform-d and dichloromethane-d2 (methylene chloride-d2) as well as other less common solvents such as dichloroethane and trichloroethane. Also, acetone-d6, though not a chlorinated solvent, is commonly used in NMR work and can cause cap loosening as well.

Data

In accordance with an aspect of the present invention, NMR tubes provided with and without a locking ring of the present invention containing a solution of chloroform-d ($CDCl_3$) were tested for the ability of a cap, with or without a secondary locking seal of the present invention, to maintain seating on the open end of a tube over the course of 50+ hours. Chloroform-d is a common stable isotope labeled solvent used extensively in NMR spectroscopy (the properties of chloroform-d are very similar to standard, or non-labeled chloroform). The interior surfaces of the caps were exposed only to chloroform-d vapor (not liquid solvent) contained within the headspace of the capped NMR tubes, for the specified time period shown in the table.

To test the retention of the cap to the NMR tube, a very light pull was manually applied with light incidental shaking to the capped NMR tube, while holding only the cap. When this action was performed, the cap and tube were aligned vertically. Thus the approximate amount of downward force applied to the tube was approximately proportional to the mass of the tube and gravitational acceleration on earth; i.e. $F=m*g$ (where F is the force of gravity; m is the mass; and g is 9.8 m/s^2). Thus, for a NMR sample tube that weighs approximately 2.13 grams, the gravitational force is about 0.0208 N. This action was to simulate the types of forces commonly applied to the NMR tube and cap during normal use. The cap and NMR tube were evaluated for whether one separated from the other.

The data in the table below was obtained by testing 5 mm NMR tube caps of the indicated design over the time frames indicated. The average increase of internal cap diameter as a result of exposure to the volatile solvent is also indicated below.

TABLE 1

Table Showing Cap Retention After Exposure to Chloroform-d ($CDCl_3$) Vapor

| | Time (hours) | | | | | | | | | | |
|---|---|---|---|---|---|---|---|---|---|---|---|
| | 0.5 | 1.0 | 1.5 | 2.0 | 3.0 | 4.0 | 5.0 | 6.0 | 24 | 50 | Longer (8 weeks) |
| % Average Increase of Cap Internal Diameter | 0 | 0 | 0.16 | 0.26 | 0.52 | 0.78 | 0.93 | 0.93 | 1.45 | 1.45 | 1.45 |
| Traditional Cap w/Traditional Tube (Does cap stay on?: YES/NO) | YES | YES | NO | NO | NO | NO | NO | NO | NO | NO | NO |
| New Locking Seal Cap w/Traditional Tube (Does cap stay on?: YES/NO) | YES | YES | YES | YES | YES | NO | NO | NO | NO | NO | NO |
| New Locking Seal Cap w/Locking Band Tube (Does cap stay on?: YES/NO) | YES | YES | YES | YES | YES | YES | YES | YES | YES | YES | YES |

The "traditional" NMR tube cap used in the above experiment was the NMR cap shown and described in U.S. Pat. No. 8,054,080, the entirety of which is herein incorporated by reference, which is the closest known NMR tube cap design to the present invention. The new locking seal cap and locking band tube used in the experiment were as shown and described above. The "traditional" NMR tube was without any locking band, or other screen printed design, on the outside of the tube.

As is apparent in the data above, the new locking seal cap has superior retention properties when used alone or in combination with locking band when compared to the traditional NMR tube cap. After 1.5 hours of exposure to chloroform-d, the inner diameter of caps increases by an average of 0.16%. At that time of exposure, the traditional NMR tube cap is no longer able to maintain seating on the traditional NMR tube under the conditions of normal use (See Table 1). By contrast, the new locking seal cap is able to maintain seating on the traditional NMR tube for up to 3 hours of exposure to chloroform-d (See Table 1). Thus, the new locking seal cap has a 100% improvement in retention with the traditional NMR tube, effectively doubling the time a cap can be exposed to solvent before retention problems occur.

When the new locking cap is combined with an NMR tube with the new locking band, the improvement in retention is even more dramatic. The current data suggests that the locking seal cap will remain seated on the locking band tube under normal handling conditions indefinitely. As shown above, even after eight weeks of exposure to chloroform-d, with the increase in cap diameter plateauing at 1.45%, the locking seal cap is retained on the locking band tube under normal handling conditions (See Table 1). Thus, the current data shows that the locking seal cap is able to maintain seating on the locking band tube at least 896 times longer than the traditional cap on a traditional tube (See Table 1).

Thus, the problem of losing cap retention after exposure to solvents may be virtually eliminated by using the locking seal cap and locking band tube as shown and described above.

The data in the above table was derived by testing 5 mm NMR tube caps. 3 mm NMR tube caps are initially more resistant to chloroform exposure and subsequent loss of retention, but reach a comparable state of expansion following an additional exposure time of about 2 hours.

Below are 2 tables for 5 mm and 3 mm NorLoc™ caps, respectively, modified in accordance with the present invention showing the measured increase of the cap inner diameter (ID) after exposure to chloroform-d vapor for the specified periods of time. The caps were not permitted to contact liquid solvent, but all surfaces, both inside and out, were exposed to a saturated atmosphere of solvent. In this respect, the following tests differ slightly from those in Table 1 where only the interior surfaces of the caps were exposed to solvent vapor contained within the capped NMR tubes.

TABLE 2

ID Expansion of 5 mm NorLoc ™ Caps Upon Exposure to Chloroform-d (CDCl$_3$) Vapor

| Sample Number | Initial ID, in | ID Measurement In Decimal Inches After Specified Exposure Time (measured with pin gauges) | | | | | | | | | |
|---|---|---|---|---|---|---|---|---|---|---|---|
| | | 0.5 hr | 1.0 hr | 1.5 hr | 2.0 hr | 3.0 hr | 4.0 hr | 5.0 hr | 6.0 hr | 24 hr | 50 hr |
| 1 | 0.193 | 0.193 | 0.193 | 0.194 | 0.194 | 0.1945 | 0.195 | 0.196 | 0.196 | 0.198 | 0.198 |
| 2 | 0.193 | 0.193 | 0.193 | 0.193 | 0.193 | 0.1935 | 0.194 | 0.194 | 0.194 | 0.194 | 0.194 |
| 3 | 0.193 | 0.193 | 0.193 | 0.193 | 0.1935 | 0.194 | 0.1945 | 0.1945 | 0.1945 | 0.1955 | 0.1955 |
| Average | 0.193 | 0.193 | 0.193 | 0.1933 | 0.1935 | 0.1940 | 0.1945 | 0.1948 | 0.1948 | 0.1958 | 0.1958 |
| % Average ID Increase | N/A | 0 | 0 | 0.16 | 0.26 | 0.52 | 0.78 | 0.93 | 0.93 | 1.45 | 1.45 |

Test samples were red color LDPE Closed Port caps suspended in a closed vessel above liquid chloroform-d (CDCl$_3$) to permit exposure to vapor only.

TABLE 3

ID Expansion of 3 mm NorLoc ™ Caps Upon Exposure to Chloroform-d (CDCl$_3$) Vapor

| Sample Number | Initial ID, in | ID Measurement In Decimal Inches After Specified Exposure Time (measured with pin gauges) | | | | | | | | | |
|---|---|---|---|---|---|---|---|---|---|---|---|
| | | 0.5 hr | 1.0 hr | 1.5 hr | 2.0 hr | 3.0 hr | 4.0 hr | 5.0 hr | 6.0 hr | 24 hr | 50 hr |
| 1 | 0.113 | 0.113 | 0.113 | 0.113 | 0.1135 | 0.1135 | 0.114 | 0.114 | 0.1145 | 0.117 | 0.117 |
| 2 | 0.114 | 0.114 | 0.114 | 0.114 | 0.114 | 0.114 | 0.114 | 0.114 | 0.115 | 0.1185 | 0.1185 |
| 3 | 0.113 | 0.113 | 0.113 | 0.113 | 0.1135 | 0.1135 | 0.1135 | 0.114 | 0.1145 | 0.1175 | 0.1175 |
| Average | 0.1133 | 0.1133 | 0.1133 | 0.1133 | 0.1137 | 0.1137 | 0.1138 | 0.114 | 0.1147 | 0.1177 | 0.1177 |
| % Average ID Increase | N/A | 0 | 0 | 0 | 0.35 | 0.35 | 0.44 | 0.62 | 1.24 | 3.88 | 3.88 |

Test samples were red color LDPE Closed Port caps suspended in a closed vessel above liquid chloroform-d (CDCl$_3$) to permit exposure to vapor only.

The data represented in Tables 2 and 3 show that there is an expansion of the internal diameter of both 5 mm an 3 mm traditional Norloc caps after exposure to chloroform-d vapor. In both cases, the increase of internal diameter plateaus after approximately 24 hours of exposure to solvent vapor.

Screen Printing Material

One or more embodiments of the present invention may comprise a material deposited on the outer surface of the NMR tube. This material may be an epoxy-based two component, permanent ink such as Enthone® 50 Series Cat-L-Ink (manufactured by Enthone, Inc., New Haven, Conn. 06508), or any other material that has strong adhesion to glass. The technical data sheet for Enthone® 50 Series Cat-L-Ink issued Jan. 30, 2008, is herein incorporated by reference in its entirety. The color of the material deposited on the surface of the NMR tube may be any one of: white, white matte, hi-hide white; lemon yellow; medium yellow; orange; emerald green; deep green; ultramarine blue; light blue; deep red; medium red; chocolate brown; black; black matte; black gloss; clear gloss; clear matte; among others.

The predominant component of the material is the ink base, which is mixed with a catalyst component followed by heat curing to facilitate hardening. For example, the catalyst component may be Enthone® Catalyst Number 9 (manufactured by Enthone, Inc., New Haven, Conn. 06508). The catalyst is composed of tetraethylenepentamine (40-50% w/w) in a solvent of ethylene glycol butyl ether (40-50% w/w). Catalyst Number 9 is a heat cure only catalyst possessing good anti-yellowing resistance, especially when in combination with a white color ink.

One or more embodiments of the deposition material may further comprise a solid filler material or flatting agent used to impart a matte finish and/or increase the coefficient of friction of the NMR tube surface. This material may consist of very finely powdered (generally known as fumed or colloidal) silica (silicon dioxide), such as SIPI414 Cabosil® pigment, a type of fumed silica.

Various aspects of the present invention employ a liquid mixture of ink, catalyst, and silica that may be applied by a screen printing process using, specifically, "The AUTO-PAK™ Automatic Cylindrical Screen Process Printer" (manufactured by Joseph E. Podgor Co., Inc., 7551 Central Highway, Pennsauken, N.J. 08109) followed immediately by passage on a chain conveyor system through an oven with temperature control of ±5° F. The thickness of the screen will determine the thickness of the deposited material. In one or more embodiments the thickness of the deposited material is in the range of 0.0001 to 0.0004 inches, or in the range of 0.0002 to 0.0003 inches, or approximately 0.00025 inches. In other embodiments, the thickness of the deposited material will be 0.0001 to 0.0014 inches.

Various embodiments of the invention may employ a deposited material comprising the following components in the following ranges:

| Component | Possible Range of Values (in percent by weight, % w/w) |
| --- | --- |
| Ink | 70.0-97.0 |
| Catalyst | 3.0-10.0 |
| Fumed Silica Filler | 0-20 |

In other embodiments, the values (in percent by weight, % w/w) may be approximately 93.8% ink, 3.6% catalyst, 2.6% fumed silica filler. In other embodiments, the curing agent may be 5.0% or 5.1% w/w.

In various embodiments, the AUTO-PAK™ screen printer may be used as originally supplied by the manufacturer, or may be used with an additional length of custom built oven added (e.g. approximately 12 feet). The curing oven length may be adapted to achieve the minimum exposure time (residence time) necessary at a desired printing speed to heat and cure the freshly applied catalyzed epoxy ink to a predetermined degree of hardness.

One or more embodiments of the invention may employ material deposited on an NMR tube and cured at a temperature below 300 degrees F. At such temperatures, the color of the ink does not change to a degree that is perceptible to the human eye. In some embodiments, the deposited material may be cured at a temperature of 250 degrees F. for approximately 3 minutes, causing no perceptible color change of the ink, followed by continued curing at room temperature for several hours. To verify the absence of any yellowing of white ink, or color changes in any of the other various color inks, a simple visual comparison may be made between the test sample and a reference standard, such as a piece of white paper or a previously screen printed NMR tube deemed to be acceptable. Alternatively, colors, including varying shades of white, can be quantified using instruments such as a tristimulus colorimeter which measures the CIE XYZ Color Space Tristimulus Values (See e.g., J. Soc. Cosmetic Chemists, 19, 649-667 (Sep. 16, 1968) which is incorporated by reference in its entirety). Alternatively, the absolute spectral reflectance or transmittance of a sample may be determined using a spectrophotometer. One or more of these methods may be used to convert the spectral measurements to a standard reference color contained in the Pantone® Color Guide, which is can be used as a reference for color comparison or verification, the entirety of which is herein incorporated by reference. In one or more embodiments of the invention, the difference in tristimulus values of a CIE color of the cured ink relative to a reference standard may be less than 50%, less than 25%, less than 10% or less than 1%.

Placement of material on NMR tubes

Figure 16:
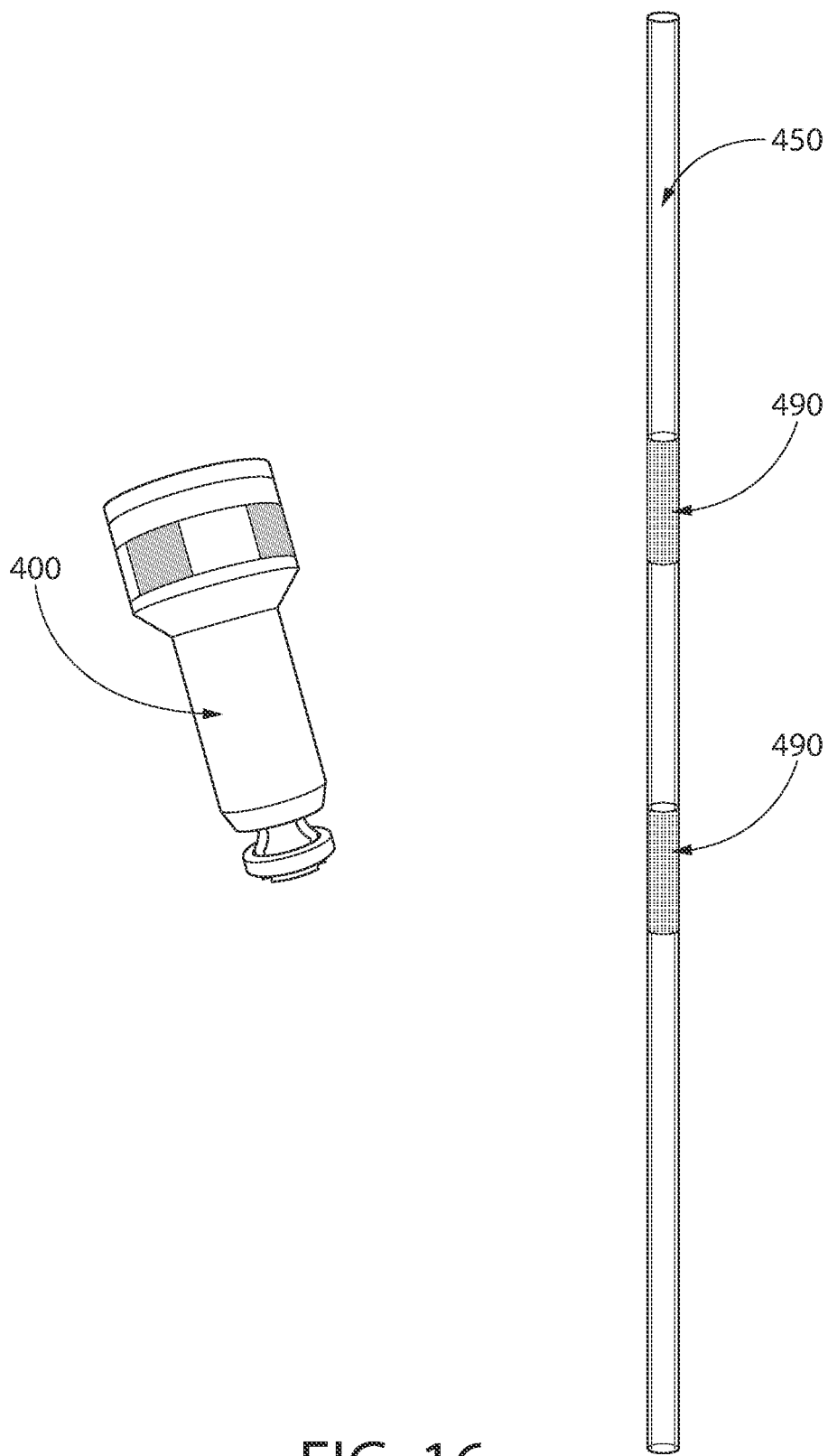
FIG. 16 is a side view of a turbine and a NMR tube according to one embodiment of the present invention.
Figure 17:
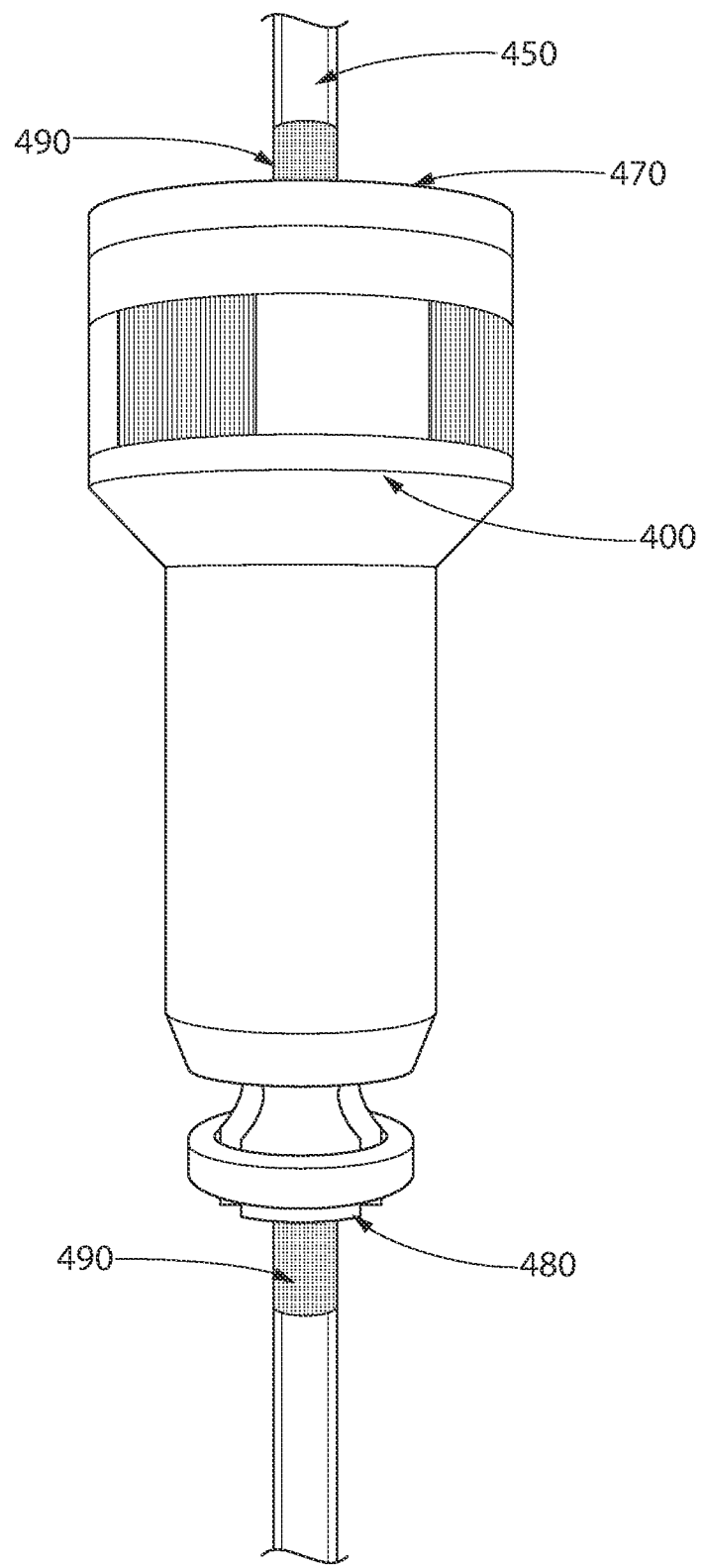
FIG. 17 is a side view of a NMR tube inserted in a turbine, according to one embodiment of the present invention.
Figure 18:
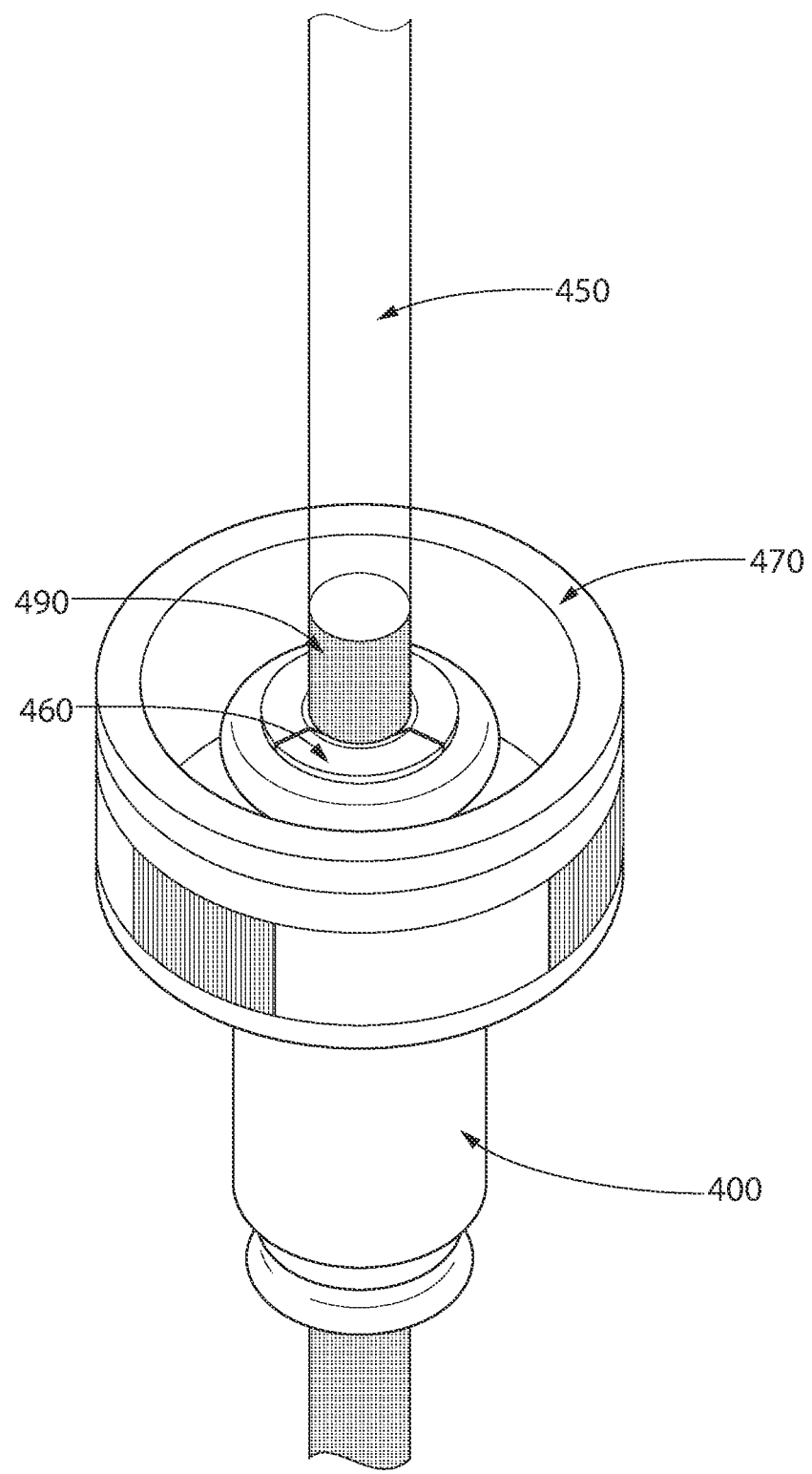
FIG. 18 is an above perspective view of an NMR tube inserted in a turbine, according to one embodiment of the present invention.

One or more embodiments of the present invention may employ material deposited on an NMR tube at a position where contact is made with another object. In this manner, the deposited material may enhance retention of the object on the NMR tube during normal use. For example, as shown in FIGS. 16-18, NMR tubes are often inserted into spinner turbines 400 prior to and during measurement of NMR spectra. These spinner turbines 400 define a hollow bore, through which the NMR tube is inserted. As some position within the hollow bore, some part of the turbine protrudes 460, narrowing the hollow bore, thereby contacting or "griping" the NMR tube. While the NMR tube is placed in the turbine, the contacting or gripping parts 460 of the turbine are intended to retain the tube at the desired position in the turbine during use in the NMR machine. However, it is possible for the tube to change position relative turbine by slipping, and in some cases the tube may slip out of the turbine. This problem is compounded by the fact that the NMR tube needs to be placed in a particular position relative to the turbine to optimally obtain NMR spectra. Thus, there is a need for an NMR tube that can both prevent slippage of the tube in the turbine and that can be quickly and simply placed at an optimal position relative to the turbine.

Various turbines contact the NMR tubes at certain positions along the NMR tube length. One or more embodiments of the present invention may employ deposited material on the outer surface of the NMR tube at a position where contact with the turbine is made, with the deposited material having a frictional coefficient higher than glass. In this manner, various embodiments of NMR tubes may have regions of material with higher frictional coefficients, reducing the chance that a spinner turbine may unintentionally slip off the NMR tube.

Figure 13:
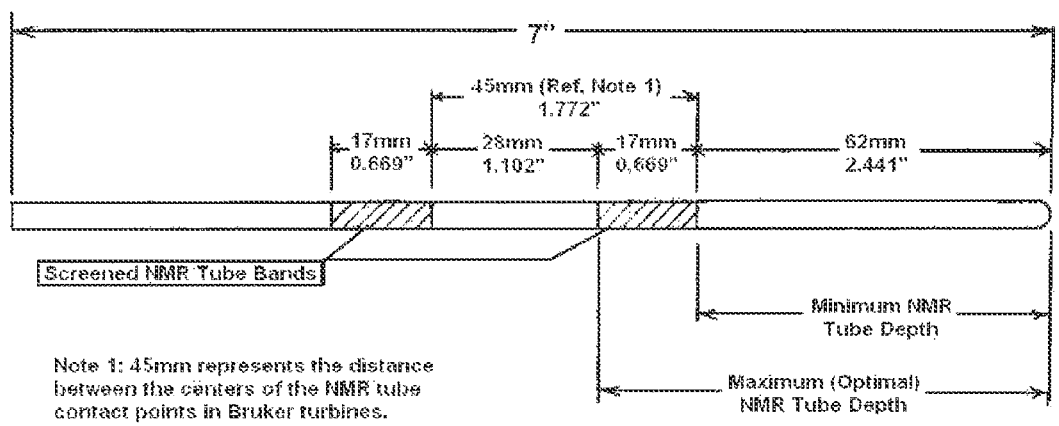
FIG. 13 is a side view schematic of an NMR tube showing placement of screen printed bands according to one embodiment of the present invention.
Figure 14:
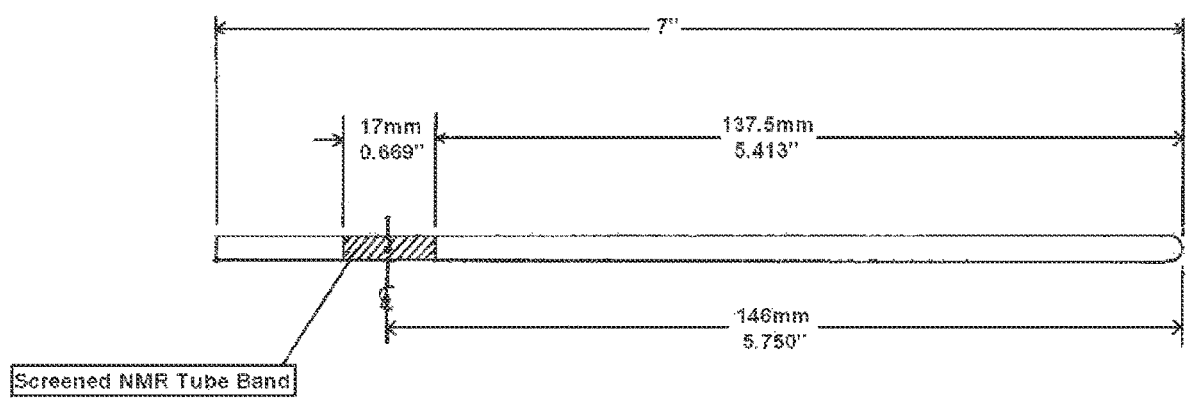
FIG. 14 is a side view schematic of an NMR tube showing placement of screen printed bands according to one embodiment of the present invention.
Figure 15:
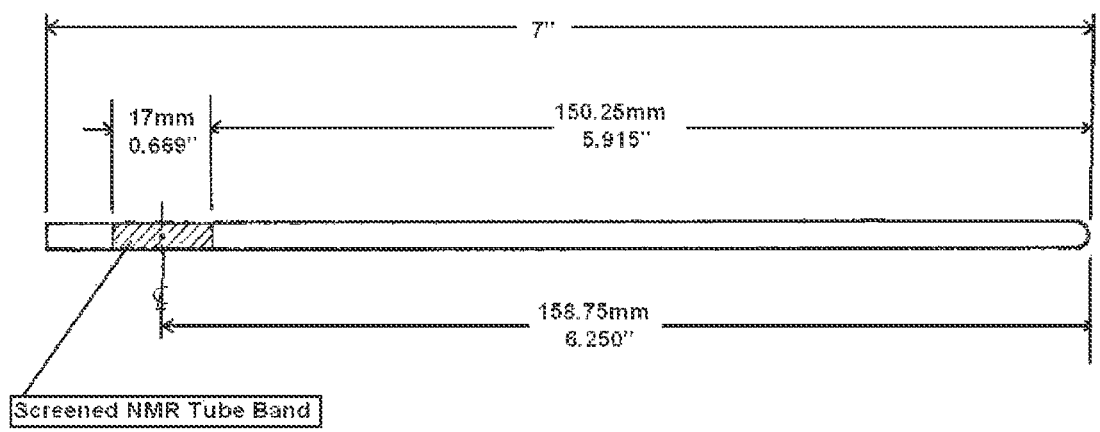
FIG. 15 is a side view schematic of an NMR tube showing placement of screen printed bands according to one embodiment of the present invention.

By way of non-limiting example, FIGS. 13-15 illustrate various embodiments of the invention showing placement of material deposited in bands centered around turbine contact points. Each of FIG. 13-15 show the position of a band of material deposited on a 7 inch NMR tube, with each band centered on a contact point for a particular turbine. For example, according to one embodiment of the invention, FIG. 13 shows placement of the center of bands at 2.7755 inches above the bottom (closed end) and 4.5465 inches above the bottom (closed end) of the tube, centered on the contact points for the 3 mm tube and 5 mm tube Bruker turbine. As shown in the figure the bands have an approximate width of 0.669 inches and are solid, so as to cover the minimum and maximum (optimal) NMR tube depth while inserted in the turbine. However, in various embodiments of the invention, the bands may be wider than or less wide than the minimum and maximum tube depth as shown in the figures. For example, the width of the bands may be less than 3 inches, less than 2 inches, less than 1 inch, or less than half an inch. Also, while the NMR tube represented in FIG. 13 comprises two bands, various embodiments of the invention may comprise one band or more than two bands. Furthermore, while FIG. 13 shows the exemplary bands as being solid, various embodiments of the invention may comprise continuous or discontinuous bands, comprised of various shapes, patterns, or characters. The bands deposited in the various embodiments may cover the entire circumference of the tube or may cover only part of the circumference of the tube. For example, in one or more embodiments, the material may cover more than ⅙ of the tube circumference, more than ¼ of the tube circumference, or more than ½ of the tube circumference.

As shown in FIG. 14, a single band is placed on the NMR tube at the preferred contact point for the 5 mm JEOL turbine. This contact point is located along the length of the NMR tube at approximately 5.75 inches from the bottom (closed end) of the tube. Similarly, as shown in FIG. 15, a single band is placed on the NMR tube at the preferred contact point for the 5 mm Agilent/Varian Turbine. This contact point is located along the length of the NMR tube at approximately 6.25 inches from the bottom (closed end) of the tube.

In addition to the deposited material acting to prevent the NMR tube from slipping out of the turbine, one or more embodiments of the present invention may use the deposited material as a reference mark for proper seating of the NMR tube in the turbine. For example, in some embodiments, one or more bands of deposited material may have an edge that indicates the optimal position of the tube in the turbine, which can be manually aligned with the top or bottom edge of the turbine by the user. This feature will allow the user to properly position the NMR tube in the turbine without having to use an external depth gauge. Alternatively, part of one or more bands of deposited material may have a distinct visual appearance (such as color or pattern) that would indicate where the top or bottom edge of the turbine should be in relation to the tube. For example, within a band of deposited material, an additional distinctly colored band may be present, indicating to the user where the top of the turbine should be aligned. In yet further embodiments, the proper positioning of the turbine may be indicated by a change in texture from glass to deposited material that can be felt by the user as the tube is slid into a turbine. For example, the transition point from glass to deposited material may be positioned such that the edge touches the contacts (or grippers) of the turbine at a point that places the turbine in the optimal position relative to the tube. In this manner, the user would be able to feel (by tactile sensation) when the tube is slid into the optimal position relative to the turbine.

In further embodiments of the present invention, the width of a band of deposited material may indicate a range of insertion depths of the NMR tube relative to the turbine, from a minimum to a maximum. For example, one or more deposited bands may be 0.669 inches wide with the edge closest to the open end of the tube indicating the maximum (optimal) depth and the edge closest to the closed end of the tube indicating the minimum depth. Thus, the top 470 or bottom 480 edge of the turbine may fall anywhere inside the one or more bands of material 490, indicating that the tube is in an acceptable position relative to the turbine. See e.g. FIGS. 16-18.

In further embodiments of the present invention, two or more bands of material may be deposited on an NMR tube relative to each other. For example, as shown in FIG. 13, one embodiment of the invention may comprise two bands, each band having two edges, with each of the top edges of the two bands, and each of the bottom edges of the two bands being a distance of 1.772 inches apart.

In yet other embodiments, bands of fixed distance between each other may be positioned to contact one or more gripping parts of a turbine. For example, turbines the distance and positioning of material deposited on a NMR tube may be adapted to contact the appropriate gipping parts of the turbine on a 4 inch NMR tube.

Any of the above described features may be used in combination with one another. For example, any combination of bands of material deposited on the surface of the NMR tube to enhance gripping of the turbine may be used along with the new NMR tube locking seal cap and band. A single NMR tube, according to the present invention, can include any of the bands or printed areas described herein. Further, any of the bands can use any of the various ink based compositions described herein. Thus, for example, an NMR tube can include areas 121 and band 123 (FIG. 12) as well as bands meant to interface with a turbine, such as those show in FIG. 13. Each of these bands can be printed on the NMR tube with the same ink-based composition or each can be printed with a different in composition.

An NMR tube, such as the one disclosed in FIG. 13, and a turbine, are used together in accordance with an aspect of the present invention. As is conventional, the NMR tube is inserted into the turbine. According to the method, the first band on the NMR tube (the band closer to the closed end of the NMR tube) is fully inserted into the turbine. Thus, the NMR tube is pushed until the first band disappears. Then, the NMR tube is further inserted into the turbine until the top part of the second band is visible, but the other part of the second band is hidden inside the turbine. The two bands on the NMR tube are spaced apart by a defined amount, as previously described. The turbine interfaces with the NMR tube at two points, the two points being separated by the defined amount. Thus, when the NMR tube is inserted into the turbine such that the top part of the second band is visible, the bands on the NMR tube interface with the turbine. This interface provides a significantly improved grip on the NMR tube by the turbine and prevents the NMR tube from sliding out of the turbine.

While the invention has heretofore been described with certain degrees of particularity, there are countless configurations for the NMR tube and cap of the present invention. FIG. 1 through FIG. 18 illustrate only a few possible configurations, and in no way should be construed as limiting the application of the inventive apparatus to those configurations. To the contrary, the invention is intended to cover various modifications and equivalent arrangements included within the spirit and scope of the appended claims.

The scope of the following claims is to be accorded the broadest interpretation so as to encompass all such modifications and equivalent structures and functions.

What is claimed is:

1. A spectroscopy apparatus comprising:
   a Nuclear Magnetic Resonance (NMR) tube comprising:
      a closed bottom end, an open top end, an inner surface that defines a cavity, and an outer surface; and
      a locking feature located on the outer surface of the NMR tube adjacent to the open top end of the NMR tube, wherein the locking feature comprises an ink that is deposited onto the outer surface of the NMR tube; and
   a closure detachably coupled to the NMR tube, the closure comprising an engagement feature that engages the locking feature to secure the closure to the NMR tube.

2. The spectroscopy apparatus according to claim 1 wherein the locking feature is screen printed onto the outer surface of the NMR tube.

3. The spectroscopy apparatus according to claim 2 wherein the locking feature comprising an ink comprises the ink and a catalyst.

4. The spectroscopy apparatus according to claim 3 wherein the locking feature further comprises a silica filler, wherein the ink is an epoxy based screen printing ink, and wherein the epoxy based screen printing ink is white with no yellowing perceivable to a human eye after being heated to about 250° F. for about 3 minutes.

5. The spectroscopy apparatus according to claim 1 wherein the locking feature on the NMR tube is hidden within the closure when the closure is coupled to the NMR tube.

6. The spectroscopy apparatus according to claim 1 wherein the locking feature is screen printed onto the outer surface of the NMR tube so that the locking feature comprises one or more raised edges, and wherein the engagement feature of the closure engages the one or more raised edges of the locking feature deposited onto the outer surface of the NMR tube.

7. The spectroscopy apparatus according to claim 1 wherein the locking feature comprises a thickness in a range of 0.0001 to 0.0004 inches.

8. The spectroscopy apparatus according to claim 1 wherein the closure comprises an inner surface that defines a hollow bore having an open bottom end and a closed top end, wherein a proximal portion of the NMR tube nests within the hollow bore of the closure when the closure is coupled to the NMR tube, and wherein the engagement feature is located on the inner surface of the closure.

9. The spectroscopy apparatus according to claim 1 wherein the locking feature is a ring or a band that extends partially or completely around a circumference of the NMR tube.

10. The spectroscopy apparatus according to claim 1 further comprising:
    a marking area positioned on the outer surface of the NMR tube, the marking area comprising a top edge that is located at a first distance from the open top end of the NMR tube; and
    wherein the locking feature is positioned between the top edge of the marking area and the open top end of the NMR tube, the top edge of the marking area being spaced apart from a bottom edge of the locking feature so that a portion of the outer surface of the NMR tube located between the marking area and the locking feature is exposed.

11. The spectroscopy apparatus according to claim 10 wherein the cavity extends along a cavity axis and the top edge of the marking area lies in a reference plane that is perpendicular to the cavity axis.

12. The spectroscopy apparatus according to claim 11 wherein the marking area comprises a first portion that includes a bottom end and has a first width measured in a direction transverse to the cavity axis and a second portion that comprises the top edge and has a second width measured in the direction transverse to the cavity axis, the second width being greater than the first width.

13. The spectroscopy apparatus according to claim 10 wherein the marking area and the locking feature are printed onto the outer surface of the NMR tube using an ink-based composition.

14. The spectroscopy apparatus according to claim 10 wherein a bottom edge of the closure contacts the top edge of the marking area when the closure is fully and correctly coupled to the NMR tube.

15. The spectroscopy apparatus according to claim 10 further comprising one or more bands of material deposited onto the outer surface of the NMR tube at a position between the marking area and the closed bottom end of the NMR tube.

16. The spectroscopy apparatus according to claim 15 wherein the one or more bands of material comprises a first band and a second band that are axially spaced apart along a length of the NMR tube.

17. The spectroscopy apparatus according to claim 1 wherein the NMR tube is formed from glass and the closure is formed from low density polyethylene.

18. The spectroscopy apparatus according to claim 1 wherein the locking feature is formed from a material having a friction coefficient greater than 0.15.

19. The spectroscopy apparatus according to claim 1 wherein the locking feature is a decal that is affixed to the outer surface of the NMR tube.

20. A spectroscopy apparatus comprising:
    a tube comprising:
       a closed bottom end, an open top end, an inner surface that defines a cavity, and an outer surface; and
       a locking feature comprising an ink-based composition screen printed on the outer surface of the NMR tube; and
    a closure detachably coupled to the NMR tube, the closure comprising an engagement feature that engages the locking feature to secure the closure to the NMR tube, wherein the locking feature is hidden within the closure when the closure is coupled to the NMR tube.

* * * * *